(12) United States Patent
Miyamoto et al.

(10) Patent No.: US 6,589,855 B2
(45) Date of Patent: Jul. 8, 2003

(54) METHODS OF PROCESSING SEMICONDUCTOR WAFER AND PRODUCING IC CARD, AND CARRIER

(75) Inventors: Toshio Miyamoto, Kodaira (JP); Kunihiro Tsubosaki, Hino (JP); Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/991,750

(22) Filed: Nov. 26, 2001

(65) Prior Publication Data

US 2002/0048907 A1 Apr. 25, 2002

Related U.S. Application Data

(63) Continuation of application No. 09/077,548, filed on Jun. 1, 1998, now Pat. No. 6,342,434.

(30) Foreign Application Priority Data

Dec. 4, 1995 (JP) .............................................. 7-315089

(51) Int. Cl.⁷ ............................................. H01L 21/301
(52) U.S. Cl. ........................ 438/464; 438/748; 156/154
(58) Field of Search ................................ 438/113, 459, 438/464, 977, 976, 118, 748; 29/25.01; 414/935–940; 156/154

(56) References Cited

U.S. PATENT DOCUMENTS

| | | |
|---|---|---|
| 3,861,978 A | 1/1975 | Connole et al. |
| 4,339,297 A | 7/1982 | Aigo |
| 5,155,068 A | 10/1992 | Tada |
| 5,238,876 A | 8/1993 | Takeuchi et al. |
| 5,268,065 A | 12/1993 | Grupen-Shemansky |
| 5,877,034 A | 3/1999 | Ramm et al. |
| 5,897,337 A | 4/1999 | Kata et al. |

FOREIGN PATENT DOCUMENTS

| | | |
|---|---|---|
| DE | 40 02 018 | 7/1991 |
| EP | 0 312 924 | 10/1988 |
| EP | 0 318 862 | 6/1989 |
| EP | 0 622 833 | 11/1994 |
| EP | 0 828 292 | 3/1996 |
| JP | 55-160440 | 12/1980 |
| JP | 62-193725 | 12/1987 |
| JP | 63-256342 | 10/1988 |
| JP | 1-134945 | 5/1989 |
| JP | 2-309638 | 12/1990 |
| JP | 3-256677 | 11/1991 |
| JP | 5-82631 | 4/1993 |
| JP | 5-67371 | 9/1993 |
| JP | 6-61202 | 3/1994 |
| JP | 6-177099 | 6/1994 |
| JP | 6-224095 | 8/1994 |
| JP | 7-45583 | 2/1995 |
| JP | 7-106285 | 4/1995 |
| JP | 8-181092 | 7/1996 |

OTHER PUBLICATIONS

VLSI Packaging Technology, NIKKEI BP Co., Ltd., May 31, 1993, pp. 12–14.

*Primary Examiner*—Wael Fabmy
*Assistant Examiner*—Ginette Peralta
(74) *Attorney, Agent, or Firm*—Mattingly, Stanger & Malur, P.C.

(57) ABSTRACT

The semiconductor wafer is made thin without any cracks and warp under good workability. The semiconductor wafer thinning process includes the first step of preparing a carrier 1 formed of a base 1a and a suction pad 1b provided on one surface of the base 1a or formed of a base film with an adhesive, the second step of bonding a semiconductor wafer to the carrier 1 in such a manner that a rear surface of the semiconductor wafer 2 with no circuit elements formed therein is opposite to the carrier to form a wafer composite 10, and the third step of holding the carrier of the wafer composite 10 with its semiconductor wafer 2 side up and spin-coating an etchant on the rear surface of the semiconductor wafer 2 thereby to make the semiconductor wafer 2 thin.

19 Claims, 22 Drawing Sheets

1 : CARRIER
1a : BASE
1b : SUCTION PAD
2 : SEMICONDUCTOR WAFER
10 : WAFER COMPOSITE

METHODS OF PROCESSING SEMICONDUCTOR WAFER AND PRODUCING IC CARD, AND CARRIER

This is a continuation application of U.S. Ser. No. 09/077,548 filed Jun. 1, 1998, now U.S. Pat. No. 6,342,434 allowed.

TECHNICAL FIELD

The present invention relates to semiconductor wafer processing techniques, and particularly to a technique effective for use in handling semiconductor wafers when the semiconductor wafers are processed to a very small thickness of 100 $\mu$m or below.

BACKGROUND ART

Now, in the semiconductor devices required to be thin as well as high density and small size, such as semiconductor devices applied to IC cards, thinner packages than the usual ones are used, such as TQFP (thin quad flat package) and TSOP (thin small outline package). In order to manufacture such packages, it is necessary to make the semiconductor wafers particularly thin. Here, the known techniques for making the semiconductor wafers thin, as for example described in "PRACTICAL LECTURES VlSI PACKAGING TECHNOLOGY (the second volume)" published by NIKKEI BP Co., Ltd. on May 31, 1993, pp. 12 to 14, are three types of grinding, chemical etching and lapping. As in the publication, the grinding is the technique for grinding the rear surface of a semiconductor wafer with a diamond grindstone, the etching is the technique for etching the rear surface of a semiconductor wafer with a mixture of chiefly fluoric acid and nitric acid while the semiconductor wafer is being rotated with high speed, and the lapping is the technique for grinding the rear surface of a semiconductor wafer with abrasive grains.

The thinning process by the grinding or lapping is able to grind semiconductor wafers of general thickness, or about 625 $\mu$m (or 725 $\mu$m) to a thickness of about 300 $\mu$m, but has a difficulty when trying to grind to a thickness of, for example, 100 $\mu$m or below because the semiconductor wafer might be cracked even under strict care when removing it from the grinder. Even if the wafer is not cracked, it is remarkably warped depending on the stress in the passivation film on the wafer surface and the internal stress of the wafer. This warp causes operational problems in the following processes such as dicing. In addition, it is difficult to process large-diameter semiconductor wafers, or 12-inch or above wafers to a specified level of flatness and uniformity.

Moreover, in the thinning process by etching, since the wafer is rotated at high speed, an excessive stress is exerted on the semiconductor wafer by the pins that hold its outer peripheral portion at a plurality of locations, thus breaking the wafer. Furthermore, a warp will occur due to the internal stress as in the grinding.

In order to solve the above problems, the inventors have found to fix the semiconductor wafer to a certain support base with tape and process it after various examinations. However, normal tape is also discarded after use in the process of each wafer, thus increasing the cost, or causing a new problem.

Accordingly, it is an object of the invention to provide a technique capable of making semiconductor wafers thin without any crack by solving the above technical problems.

It is another object of the invention to provide a technique capable of making semiconductor wafers thin under easy operation.

It is still another object of the invention to provide a technique capable of making semiconductor wafers thin without any warp.

It is further object of the invention to provide a technique capable of making semiconductor wafers thin at low cost.

The features of the invention, and the above objects of the invention together with other objects will be best understood by the following description, taken in conjunction with the accompanying drawings.

DISCLOSURE OF INVENTION

A typical one of the inventions disclosed in this application will be described briefly as below.

The semiconductor wafer processing method according to the invention includes a first step of preparing a plate-like or film-shaped carrier that is formed of a base and an adhesive member provided on one surface of the base, a second step of producing a wafer composite by bonding a semiconductor wafer to the carrier in such a manner that the rear surface of the wafer with no circuit elements formed therein is opposite to the carrier, and a third step of making the semiconductor wafer thin by spin-coating an etchant on the rear surface of the semiconductor wafer of the wafer composite that is supported with its semiconductor wafer side up.

In this semiconductor wafer processing method, the semiconductor wafer of the wafer composite is made to have a larger diameter than the carrier so that all the outer peripheral edge of the semiconductor wafer overhangs from the carrier when the wafer composite is formed by bonding the wafer on the carrier. In the third step, the semiconductor wafer can be thinned while a gas is being blown from below against the wafer composite. In addition, the semiconductor wafer may be made to have a diameter equal to or smaller than the carrier so that the peripheral edge of the wafer does not overhang from the carrier when the wafer composite is formed.

Moreover, after the semiconductor wafer is thinned by the third step, a fourth step and a fifth step may be provided. The fourth step is for sticking the rear side of the wafer on a dicing sheet and peeling off the carrier, and the fifth step is for dicing the semiconductor wafer on the dicing sheet into individual semiconductor chips.

The semiconductor wafer processing method of the invention includes a first step of preparing a semiconductor wafer with a passivation film formed on its main surface in which circuit elements are already built, a second step of preparing a plate-like or film-like carrier that is formed of a base and an adhesive member provided on one surface of the base, a third step of producing a wafer composite by bonding the semiconductor wafer to the carrier in such a manner that the rear surface of the wafer with no circuit elements formed therein is opposite to the carrier, and a fourth step of holding the wafer composite with its semiconductor wafer side up and spin-coating an etchant on the rear surface of the semiconductor wafer thereby to thin the semiconductor wafer. In this case, after thinning the semiconductor wafer at the fourth step, it is possible to add a fifth step of attaching the rear surface of the semiconductor onto a dicing sheet and peeling off the carrier from the wafer composite, and a sixth step of dicing the semiconductor wafer left on the dicing sheet into individual semiconductor chips.

The IC card producing method according to the invention includes a first step of preparing a plate-like or film-like carrier that is formed of a base and an adhesive member provided on one side of the base, a second step of producing a wafer composite by bonding a semiconductor wafer to the carrier in such a manner that the rear surface of the wafer with no circuit elements formed therein is opposite to the carrier, a third step of holding the wafer composite with its semiconductor wafer side up and spin-coating an etchant on the rear surface of the semiconductor wafer thereby to thin the semiconductor wafer, a fourth step of attaching the thinned rear surface of the semiconductor wafer to a dicing sheet and peeling off the carrier from the wafer composite, a fifth step of dicing the semiconductor wafer left on the dicing sheet into individual semiconductor chips, a sixth step of reducing or loosing or losing the adhesion of the dicing sheet, a seventh step of mounting one or ones of the semiconductor chips on a card substrate at chip-mounting positions, and an eighth step of producing an IC card by using the card substrate with the semiconductor chip or chips mounted.

According to the invention, there is provided an IC card producing method including a first step of preparing a semiconductor wafer with a passivation film formed on its main surface in which circuit elements are already built, a second step of preparing a plate-like or film-like carrier that is formed of a base and an adhesive member provided on one surface of the base, a third step of producing a wafer composite by bonding a semiconductor wafer to the carrier in such a manner that the rear surface of the wafer with no circuit elements formed therein is opposite to the carrier, a fourth step of holding the wafer composite with its semiconductor wafer side up and spin-coating an etchant on the rear surface of the semiconductor wafer thereby to thin the semiconductor wafer, a fifth step of attaching the thinned rear side of the semiconductor wafer to a dicing sheet and peeling off the carrier from the wafer composite, a sixth step of dicing the semiconductor wafer left on the dicing sheet into individual semiconductor chips, a seventh step of reducing or loosing or losing the adhesion of the dicing sheet, an eighth step of mounting one or ones of the semiconductor chips on a card substrate at chip-mounting positions, and a ninth step of producing an IC card by using the card substrate with the semiconductor chip or chips mounted.

When bumps are formed at the chip electrodes of the semiconductor wafer in the IC card producing methods of the invention, the thickness of the adhesive member provided on the base should be equal to or larger than the height of the bumps. In addition, at the seventh step, it is desirable to directly mount the semiconductor chips on the card substrate from the dicing sheet.

Moreover, the carrier in the invention is used in the semiconductor wafer processing method, and its adhesive member comprises an elastically flexible suction pad for sucking the semiconductor wafer by vacuum. In this carrier, the suction pad may have a size enough to suck substantially all region of one surface of the semiconductor wafer. In addition, it may be formed in a ring shape along the outer periphery of the semiconductor wafer. Also, a plurality of such suction pads may be provided on all the region of one surface of the base in order to hold the semiconductor wafer at a plurality of locations.

In addition, the carrier in the invention is used in the semiconductor wafer processing method, and its adhesive member comprises a suction groove that is formed in the base to be communicated with a vacuum hole connected to a vacuum pump so that the semiconductor wafer is sucked by vacuum and peeled off from the carrier by restoring to atmospheric pressure.

Also, the carrier in the invention is used in the semiconductor wafer processing method according to the invention, and its adhesive member is constituted by a plurality of suction holes which are formed in one surface of the base at different locations to be communicated with a vacuum hole connected to a vacuum pump so that the semiconductor wafer is sucked by negative pressure and peeled off from the carrier by restoring to atmospheric pressure.

Moreover, the carrier in the invention is used in the semiconductor wafer processing method according to the invention, and its adhesive member comprises a porous member that has a great number of small holes and is provided on one surface of the base for the small holes to be communicated with a vacuum hole connected to a vacuum pump so that the semiconductor wafer is sucked by vacuum and that it is peeled off from the carrier by restoring to atmospheric pressure.

Also, the carrier in the invention is used in the semiconductor wafer processing method according to the invention, and its adhesive member includes an exfoliation portion coplanar with the base to form a plurality of small recesses, and gelled silicone interposed between the peeling portion and the semiconductor wafer to make the base adhere to the semiconductor wafer, whereby when the surroundings of the exfoliation portion are evacuated the silicone is sunk in the recesses so as to be peeled off from the semiconductor wafer. The exfoliation portion of the carrier may be a net or an irregular surface formed on the base.

In addition, the carrier employed in the semiconductor wafer processing method according to the invention has its base made of a transparent material and its adhesive member made of a UV cure-type adhesive of which the adhesion is reduced or lost by ultraviolet rays radiated through the base so that the carrier can be peeled off from the semiconductor wafer.

Also, the adhesive member employed in the semiconductor wafer processing method according to the invention is made of a temperature activation type adhesive of which the adhesion is reduced or lost by temperature change so that the carrier can be peeled off from the semiconductor wafer. The temperature activation type adhesive of this carrier may have such a characteristic that its adhesion is reduced or lost at a low temperature.

The adhesive member employed in the semiconductor wafer processing method according to the invention is a liquid that acts as an adhesive in such a manner that the semiconductor wafer and the base are made in intimate contact with each other by the interfacial force exerted therebetween and that the semiconductor wafer is peeled off from the base by ultrasonic waves.

The base of the carrier should be made of an acid-resistant material, for example, compacted fibrous fluororesin.

Thus, since the semiconductor wafer thinning process is performed on the wafer composite formed by bonding the semiconductor wafer to the carrier, any cracks can be prevented from occurring even with no strict care when the semiconductor wafer is thinned. In addition, since the reduction of the rigidity of the thinned semiconductor wafer can be compensated for by the carrier so that release of the stress in the passivation film is prevented, the semiconductor wafer is not warped. Thus, the semiconductor wafer can be stably processed to be extremely thin.

Moreover, since the wafer composite can be handled in the same way as the semiconductor wafer having a normal thickness before thinning, any cracks can be prevented form occurring on the semiconductor wafer even with no strict care, and the work for thinning can be made with ease.

In addition, since the carrier of the wafer composite is supported so that no unnecessary stress is exerted on the semiconductor wafer, any warp does not occur, and thus the semiconductor can be thinned with high quality.

If the semiconductor wafer is fixed to the base by the suction pad, the carrier is not necessary to be discarded after use, and can be simplified in its construction, and thus the semiconductor wafer can be thinned at low cost.

If the wafer composite is formed by attaching the semiconductor wafer to the base to overhang from the carrier and spin-coated with an etchant while gas is continuously blown against this wafer composite, the etchant can be surely prevented from flowing around the outer peripheral side into the main surface, thus the circuit elements being not damaged.

If the wafer composite is so formed that the outer periphery of the semiconductor wafer does not overhang from the carrier, the etchant is prevented from flowing around the peripheral side into the main surface, and thus it is not necessary to blow gas against the wafer composite. Moreover, since the thinned semiconductor wafer does not overhang from the carrier, the wafer composite can be easy to handle. Also, since all the main surface of the semiconductor wafer is covered by the carrier so that it is shielded from the external atmosphere, the rear surface of the semiconductor wafer can be etched even by dipping.

If an IC card is produced by using semiconductor chips that are produced by dicing the thinned semiconductor wafer, the IC card can be made thinner than that of the conventional one.

If the thickness of the adhesive member provided on the base is made equal to or larger than the height of the bumps formed on the semiconductor wafer, all the carrier is made in intimate contact with the semiconductor wafer so that both are not peeled off from each other. Also, if the semiconductor chips are directly mounted on the card substrate from the dicing sheet, the additional moving operation for the semiconductor chips can be omitted, thus throughput can be improved.

The peeling operation after thinning can be simplified by taking the vacuum suction structure of the carrier for sucking the semiconductor wafer or by using the adhesive member formed of the peeling portion and the adhesive sheet or formed of UV cure-type adhesive or temperature activation adhesive. Moreover, since the semiconductor wafer is always kept flat along the base, the warp of the semiconductor wafer can be effectively suppressed.

Since the carrier formed of an reversible temperature activation type adhesive can be repeatedly used in the thinning process, the thinned semiconductor wafer can be mass-produced at low cost.

Since the carrier having the base made of an acid resistant material can be repeatedly used in the thinning process, the thinned semiconductor wafer can be mass-produced at low cost.

Since the base may be made of compacted fibrous fluororesin having a feature of resistance against acid, it is possible to use various different adhesives such as-temperature activation type adhesive with weak adhesion to the base.

BEST MODE FOR CARRYING OUT THE INVENTION

Figure 1:
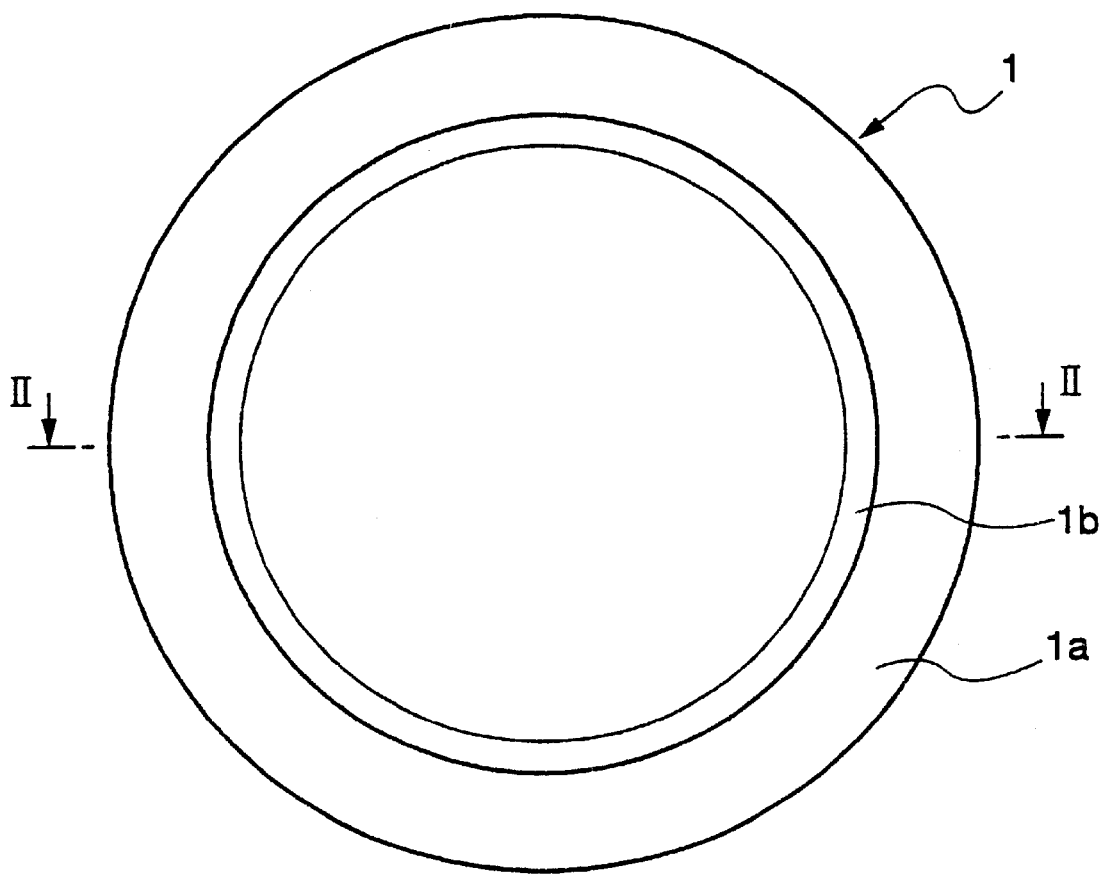
FIG. 1 is a plan view of the carrier used in the semiconductor wafer thinning process of one embodiment of the invention.

Preferred embodiments of the invention will be described in detail with reference to the accompanying drawings. In all the figures useful for the embodiments, like elements are identified by the same reference numerals, and will not be repeatedly described.

Figure 2:
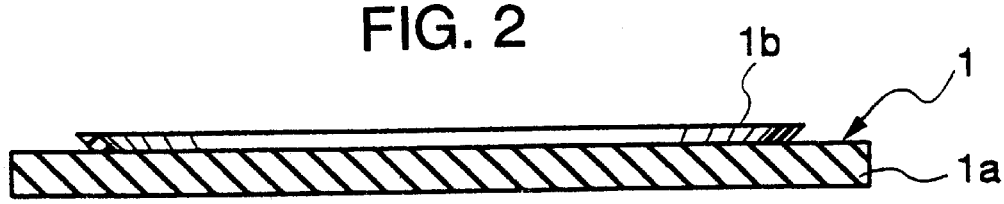
FIG. 2 is a cross-sectional view taken along a line II—II in FIG. 1.
Figure 3:
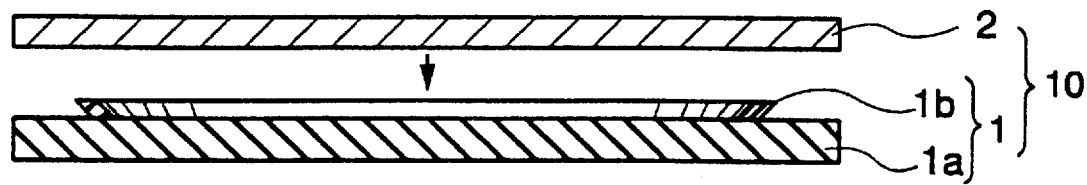
FIG. 3 shows part of the semiconductor wafer processing procedure using the carrier of FIG. 1.
Figure 4:
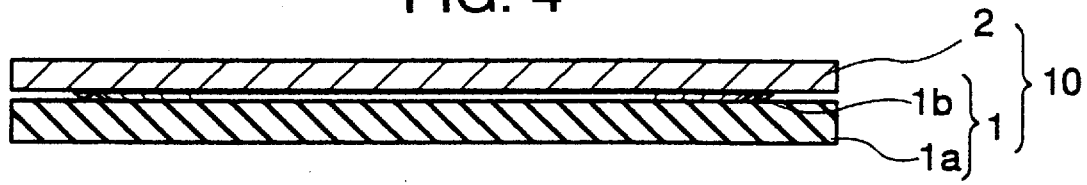
FIG. 4 is another part of the procedure using the carrier of FIG. 1 after the operation of FIG. 3.
Figure 5:
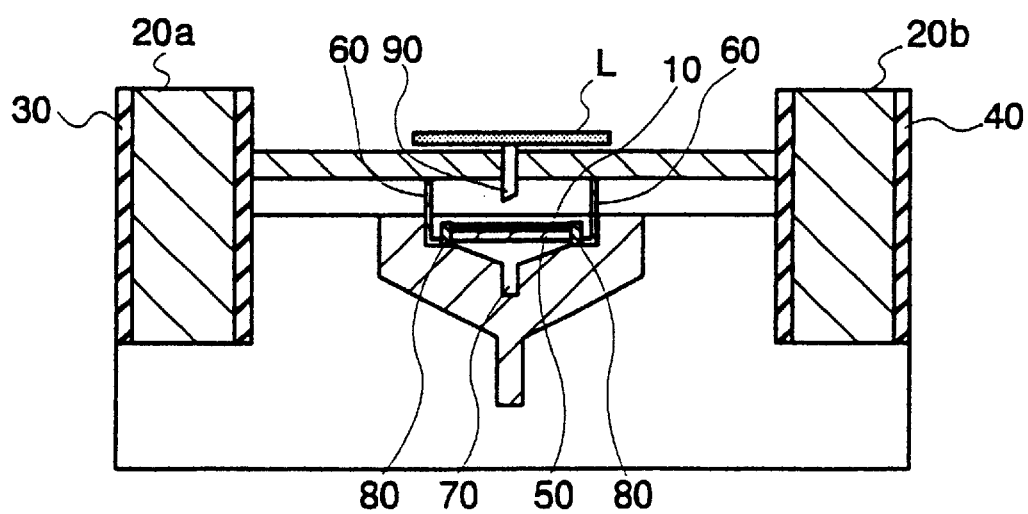
FIG. 5 is a schematic diagram of the etching apparatus used in the semiconductor wafer thinning process according to the invention.

FIG. 1 is a plan view of the carrier used in the semiconductor wafer thinning process according to one embodiment of the invention, FIG. 2 is a cross sectional view taken along the line II—II in FIG. 1, FIG. 3, FIG. 4 and FIGS. 6 to 10 are flow diagrams of the semiconductor wafer processing procedure using the carrier of FIG. 1, and FIG. 5 is a schematic diagram of the etching apparatus used in the semiconductor wafer thinning process.

Figure 6:
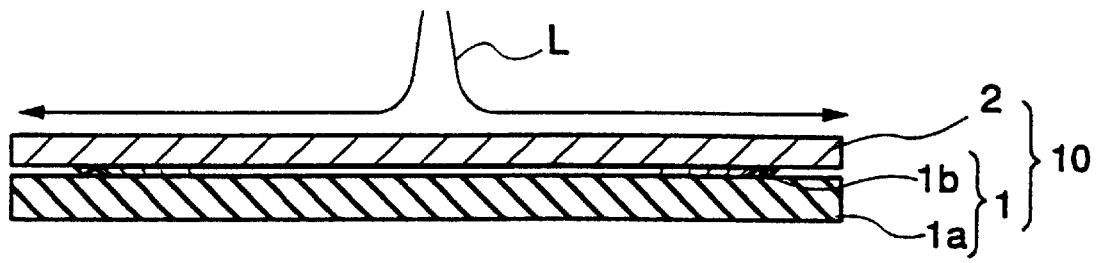
FIG. 6 shows another part of the procedure using the carrier after the operation of FIG. 4.

The carrier 1 depicted in FIGS. 1 and 2 has a plate-like shape in order for the semiconductor wafer 2 (shown in FIG. 3 and other figures) to be stuck and held on the carrier to form the wafer composite 10 (as shown in FIG. 3 and other figures). This carrier 1 is formed of a base 1a and an elastically flexible suction pad (adhesive member) 1b provided on one surface of the base 1a. The base 1a formed in a disk along the shape of the semiconductor wafer 2 is made of, for example, fluororesin, glass plate or epoxy resin which has resistance to acid. The suction pad 1b to which the semiconductor wafer 2 is stuck is made of, for example, soft rubber having a size enough to absorb, or adhere to substantially all region of one surface of the semiconductor wafer 2. In this embodiment and the following embodiments, the base 1a constituting the carrier 1 is preferably made of a material having resistance to acid as described above in order that it can be prevented from changing in quality by an etchant L (FIGS. 5, 6). In addition, in order that the semiconductor wafer 2 can be prevented from being broken by the action of concentrated stress by the supporting pins of the etching apparatus on the supported locations of the semiconductor wafer 2 as will be described later, the diameter of the base 1a is designed to be slightly, for example, about 10 μm larger than the semiconductor wafer 2.

The semiconductor wafer 2 stuck on the suction pad 1b is ground to be thin by the following process.

First, the rear surface of the semiconductor wafer 2, after the completion of the pretreatment process up to the electric examination for the circuit elements formed on the main surface, is ground to a thickness of, for example, about 250 μm with a diamond grindstone or abrasive grains. In this case, immediately the thinning process described later may be performed without this preliminary process.

Then, the semiconductor wafer 2, under the condition that its rear surface having no circuit elements is directed to the outside, or opposite to the carrier 1, is pressed against the carrier 1 as shown in FIG. 3. When a light weight is loaded uniformly on the entire surface of the semiconductor wafer 2, the suction pad 1b is elastically deformed so that the volume of the pad closed by the wafer 2 is decreased to discharge the internal air. When the load is removed from the wafer 2, the adhesion pad 1b intends to be restored by itself to the original shape. As a result, the reduced volume expands somewhat close to the original volume, but air is prevented from flowing into the pad by the wafer 2 that is made in intimate contact with the pad. Consequently, a pressure-reduced state is created within the suction pad 1b, so that the wafer 2 adheres by suction to the carrier 1. Thus, the wafer composite 10 is formed (FIG. 4). While in this embodiment the semiconductor wafer 2 and carrier 1 constituting the wafer composite 10 are equal in their diameters as depicted in FIG. 4, the wafer 2 may have a smaller diameter than the carrier 1 or may have a larger diameter than that as described later.

After the completion of wafer composite 10, a plurality of such wafer composites with their wafers 2 up are enclosed in a cassette case 20a (FIG. 5), and carried to the etching process.

FIG. 5 shows the etching apparatus for the wafer composite 10. The etching apparatus is a spinning-type etcher which coats an etchant L by spinning on the surface of the semiconductor wafer 2. This etching apparatus includes a loader 30 having the cassette case 20a, a working stage 50 on which the wafer composite 10 being processed is placed, and an unloader 40 having a cassette case 20b in which the processed wafer composite 10 is enclosed. Also, it has a handler 60 for carrying the wafer composite 10 from the loader 30 to the working stage 50, and from the working stage 50 to the unloader 40. The wafer composite 10 is carried with its rear surface lifted by this handler 50. Because an inert gas such as $N_2$ gas, or air is blown from below against the wafer composite placed on the working stage 50, an air spout 70 is provided beneath the working stage 50. In addition, supporting pins 80 are provided to grip the wafer composite 10 at, for example, three locations 120 degrees spaced along the peripheral edge of the stage 50. The supporting pins 80 can be rotated around the working stage 50 by a motor not shown, and thus the wafer composite 10 is rotated around its rotating axis by the supporting pins 80. A nozzle 90 from which the etchant L is dropped on the semiconductor wafer 2 is further provided above the working stage 50.

The handler 60 picks up one of the wafer composites 10 from the cassette case 20a that has been set in the loader 30 of the etching apparatus, and loads it on the working stage 50 with its wafer 2 side up. Here, since the handler 60 carries the wafer composite 10 with its rear surface (namely, base 1a side) lifted, such a shock as to occur when the semiconductor wafer 2 side sucked by vacuum is carried is not added to the semiconductor wafer 2, and particularly the semiconductor wafer 2 can be prevented from being cracked after the thinning process.

After loading the semiconductor wafer on the working stage 50, $N_2$ gas, for instance, is blown from the gas spout 70 against the wafer composite 10, to slightly float it from the stage 50, and it is gripped by the supporting pins 80 when floated. While the $N_2$ gas is being continuously blown against the wafer composite 10, the wafer composite 10 is rotated at a rate ranging from a few tens of turns to several thousand turns, and the etchant L is dropped from the nozzle on the semiconductor wafer 2, thus thinning it as shown in FIG. 6. For assuring the flatness after etching, it is desired that when the etchant L is dropped, the nozzle 90 be moved at a constant speed up to the outer peripheral edge through the center of the semiconductor wafer 2 while the distance between the nozzle and the wafer is maintained constant. The etching speed of the dropped etchant L is selected to be, for example, 30 µm/min, and etching time is chosen to be, for example, about 400 seconds. In order that undesired vibration due to the high-speed revolution is prevented from occurring, not to wave the etchant L causing uneven etching or not to detach the wafer 2 from the supporting pins 80, the rotation center is made coincident with the center of the wafer 2. In addition, although the constituents of etchant L to be chosen are dependent on the purpose of etching, it is desired that, in this embodiment for thinning, the etching rate be selected to be as high as 10 µm/min to 100 µm/min. Moreover, when greater importance is attached to the flatness, the etching process may be divided into two steps so that the second etching step can be performed with a lower etching rate one of etchant L. While in this embodiment the etchant L is a mixture of fluoric acid, nitric acid and phosphoric acid, it may be added with a surface active agent for controlling the reaction.

Figure 7:
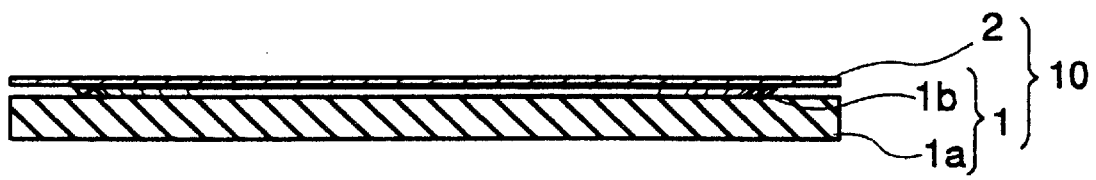
FIG. 7 shows another part of the procedure using the carrier after the operation of FIG. 6.

In this way, the semiconductor wafer 2 of the wafer composite 10 is etched to be thin up to a thickness of about 50 µm as shown in FIG. 7. In this case, the thickness is not limited to 50 µm, but may be arbitrarily selected. After etching, the semiconductor wafer 2 is rinsed with pure water, and dried by rotating it at a high speed of 1000 to 3000 rpm.

After the thinning process, the wafer composite 10 is unloaded from the working stage 50 by the handler 60, and carried into the cassette case 20b for unloader that is provided in the unloader 40. These processing steps are performed for each of all the wafer composites 10 housed in the cassette case 20a of the loader 30. After the processed wafer composites are placed in the cassette case 20b for unloader, the cassette case 20b is taken out from the etching apparatus.

Figure 8:
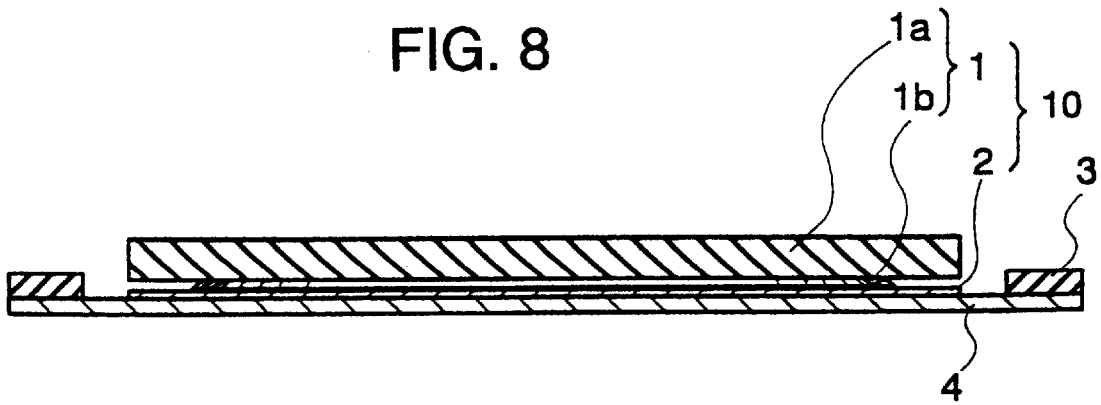
FIG. 8 shows another part of the procedure using the carrier of FIG. 1 after the operation of FIG. 7.
Figure 9:
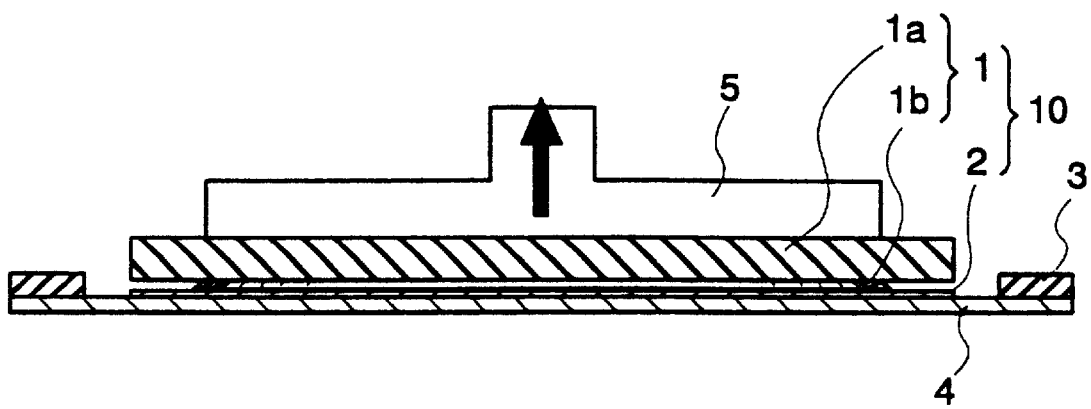
FIG. 9 shows another part of the procedure using the carrier of FIG. 1 after the operation of FIG. 8.

Then, each wafer composite 10 is drawn out from the cassette case 20b, and stuck on the dicing tape 4 with a ring 3 attached in such a manner that as illustrated in FIG. 8 the rear surface of the wafer 2 can be cemented onto the adhesive surface as in the conventional attachment of wafer 2 on tape. The dicing tape 4 used is formed of, for example, a base made of PET (polyethylene terephthalate), vinyl chloride, polyester or polyethylene, and an adhesive of acrylic polymer coated on the base. The base and adhesive may be other materials. The dicing tape may be of the self-adhesive type in which the base itself has adhesion.

Figure 10:
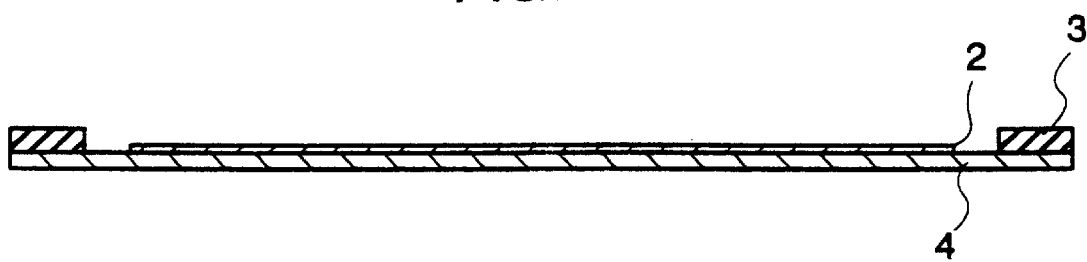
FIG. 10 shows another part of the procedure using the carrier of FIG. 1 after the operation of FIG. 9.

After attaching the wafer composite onto the dicing tape 4, a peeling jig 5 is used to peel off the carrier 1 from the semiconductor wafer 2. Thus, the semiconductor wafer 2 50 µm thick remains stuck to the dicing tape 4 (FIG. 10). Under this condition, the semiconductor wafer 2 can be diced into individual semiconductor chips. After dicing, the semiconductor chip or chips are mounted on an IC card through, for example, an anisotropically conductive connection film.

According to the semiconductor wafer 2 processing technique of this embodiment, since the semiconductor wafer 2 is stuck to the carrier 1 to form the wafer composite 10 which is then handled for the wafer 2 to be thinned, cracks and warps can be prevented without strict care, and the semiconductor wafer 2 can be stably thinned up to a very small thickness of, for example, 50 µm.

In addition, since the thinned semiconductor wafer 2 can be handled as if it were a thick semiconductor wafer before thinning, the semiconductor wafer 2 can be prevented from cracking even without great care, and thus it is easy to work for thinning.

Moreover, since the carrier 1 of the wafer composite 10 is held at different locations by the supporting pins 80, the semiconductor wafer 2 can be prevented from warping due to the stress by the supporting pins 80, and thus it can be thinned with good quality finishing.

Furthermore, since the semiconductor wafer is fixed through the suction pad 1b to the base 1a, useless throwing away of tape after use, for instance, can be omitted unlike the case of fixing on tape, and the structure of the carrier 1 can be simplified, thus the semiconductor wafer 2 being thinned at low cost.

By making the base 1a of an acid-resistant material, it is possible to repeatedly use the carrier 1, so that the semiconductor wafer 2 can be mass-produced at low cost.

Figure 11:
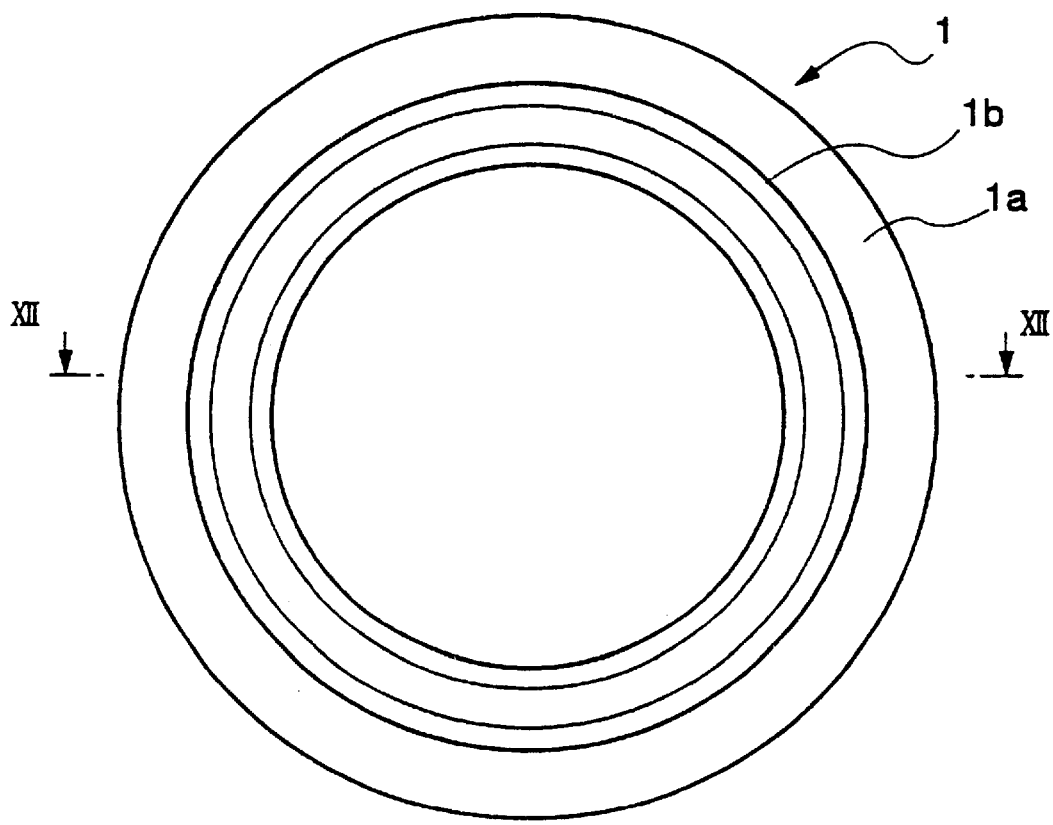
FIG. 11 is a plan view of the carrier used in the semiconductor wafer thinning process according to another embodiment of the invention.
Figure 12:
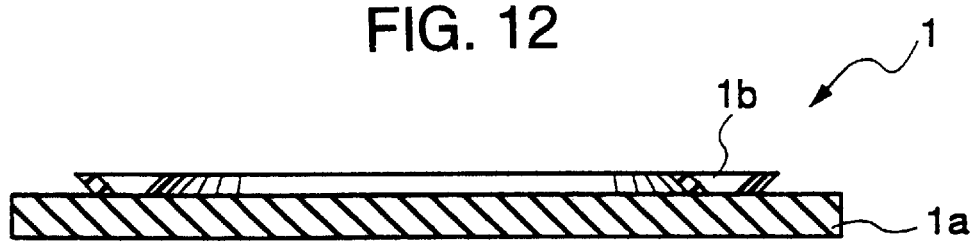
FIG. 12 is a cross-sectional view taken along a line XII—XII in FIG. 11.

FIG. 11 is a plan view of the carrier in another embodiment of the semiconductor wafer thinning process according to the invention. FIG. 12 is a cross-sectional view taken along the line XII—XII in FIG. 11.

As illustrated, the carrier 1 according to this embodiment has the suction pad 1b formed in a ring shape along the outer peripheral edge of the semiconductor wafer.

According to this carrier 1, since the holding force due to the vacuum of suction pad 1b is exerted only on the outer periphery of the semiconductor wafer, not the inner region, it is possible to suppress the warp in the semiconductor wafer due to the stress on the inner surface region.

Figure 13:
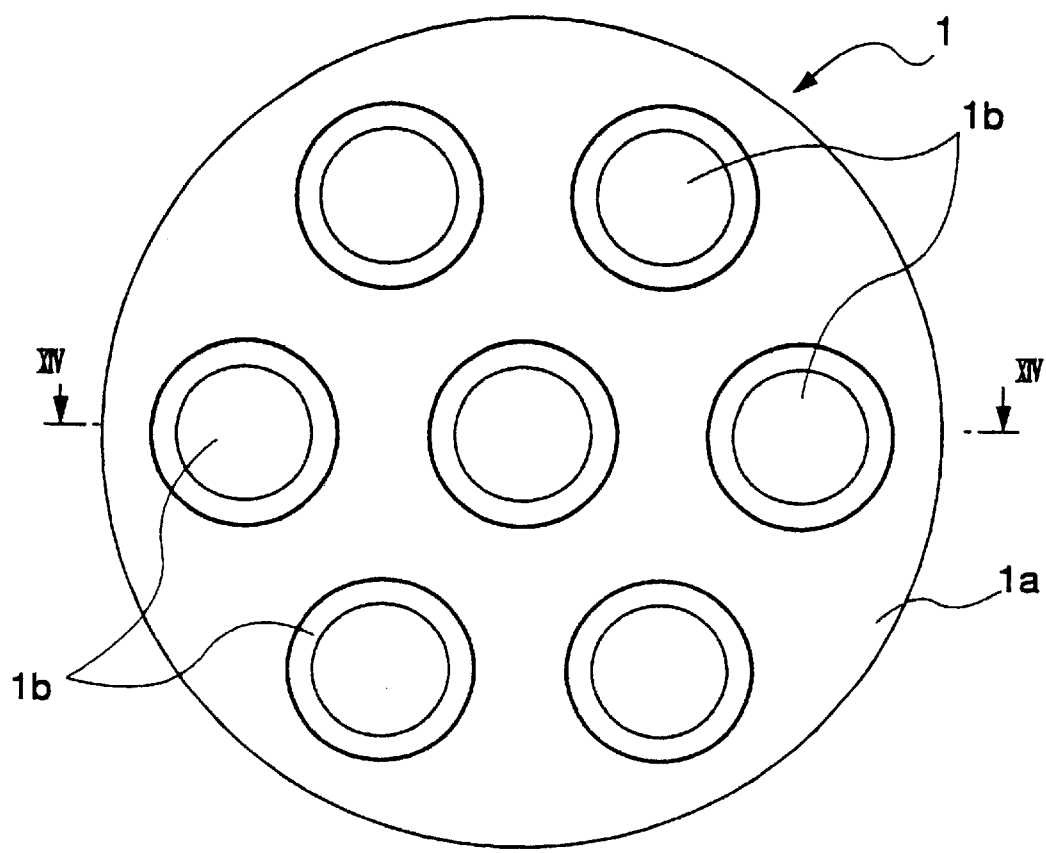
FIG. 13 is a plan view of the carrier used in the semiconductor wafer thinning process according to still another embodiment of the invention.
Figure 14:
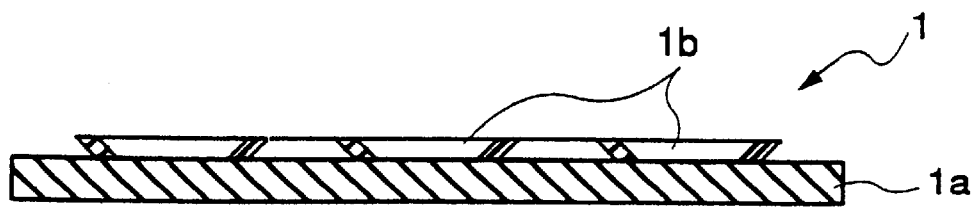
FIG. 14 is a cross-sectional view taken along a line XIV—XIV in FIG. 13.

FIG. 13 is a plan view of the carrier used in still another embodiment of the semiconductor wafer thinning process according to the invention. FIG. 14 is a cross-sectional view taken along the line XIV—XIV in FIG. 13.

The carrier 1 in this embodiment has a plurality of suction pads 1b provided over all area of one side of the base 1a. Therefore, the semiconductor wafer can be supported at a plurality of locations by these suction pads 1b.

Thus, even if some ones of the plurality of suction pads 1b are lost in their suction forces by deterioration or deformation, it is assured that the semiconductor wafer can be supported by the remaining ones 1b.

Figure 15:
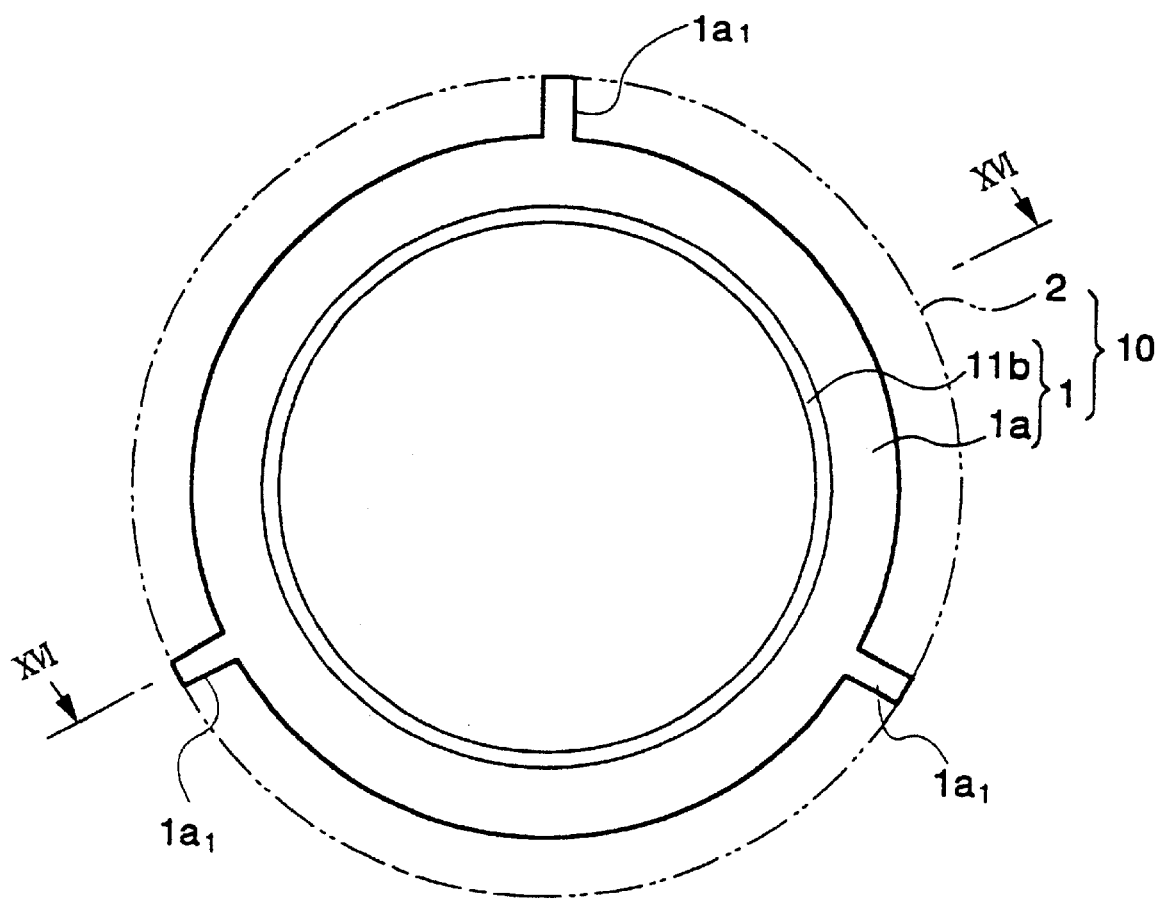
FIG. 15 is a plan view of the carrier used in the semiconductor wafer thinning process according to still another embodiment of the invention.
Figure 16:
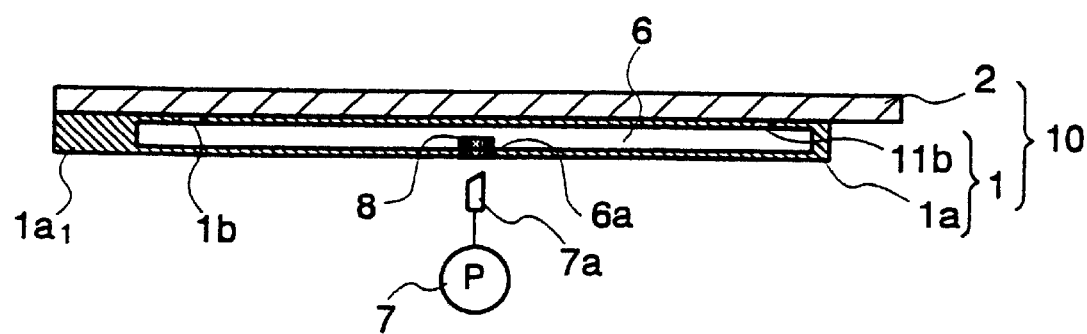
FIG. 16 is a cross-sectional view taken along a line XVI—XVI in FIG. 15.

FIG. 15 is a plan view of the carrier used in still another embodiment of the semiconductor wafer thinning process according to the invention. FIG. 16 is a cross-sectional view taken along the line XVI—XVI in FIG. 15.

The carrier 1 in this embodiment has a smaller diameter than the semiconductor wafer 2 so that the outer peripheral edge of the semiconductor wafer 2 is projected from the carrier 1. In other words, the semiconductor wafer 2 of the wafer composite 10 is overhanged from the carrier 1. In order that the supporting pins can hold the carrier 1 without being in contact with the overhanged semiconductor wafer 2, pin contact projections $1a_1$ slightly protruding outward from the semiconductor wafer 2 are formed at three different locations facing the pins along the peripheral edge of the carrier. Such a structure as in the overhanged semiconductor wafer 2 can be also applied to the carrier 1 in other embodiments. In addition, it is of course possible that even in the overhanging structure, the semiconductor wafer 2 may be directly supported without the pin contact projections $1a_1$ though it depends on the final thickness of the semiconductor wafer 2.

In addition, the base 1a has a hollow 6 which is communicated with a vacuum hole 6a, connected to a vacuum pump 7 and a circular suction groove (adhesive member) 11b for adhering to the semiconductor wafer 2 by vacuum suction is concentrically formed in the surface of the carrier 1a so that the center of the groove is coincident with the center of the base 1a. The vacuum hole 6a has a valve 8 mounted. This valve 8 is usually closed, but when a nozzle 7a of the vacuum pump 7 is inserted into the valve, the valve 8 is extended to open the vacuum hole 6a. The suction groove 11b is not always formed in a concentric circle on the base 1a, but may be of an arbitrary shape such as spiral shape. While the valve 8 is provided at the center of the base 1a as illustrated in FIG. 16, it may be mounted on, for example, the outer peripheral side of the base 1a. Moreover, the valve 8 may be of a complicated mechanical structure or of a simple elastic type such as rubber.

First, the nozzle 7a is inserted into the vacuum hole 6a to open the valve 8 of the carrier 1, and the wafer 2 is attached onto the base 1a while the hollow 6 is evacuated by the vacuum pump 7. Then, after enough evacuation is made until the semiconductor wafer 2 can be securely fixed to the base 1a, the nozzle 7a is withdrawn from the valve. Since the valve 8 opens the vacuum hole 6a to permit air to flow from the hollow 6 to the outside while the nozzle 7a stays inserted in the valve, but closes the vacuum hole 6a after the nozzle 7a is withdrawn from the valve, air can be prevented from flowing from the outside into the hollow 6 so that the semiconductor wafer 2 can be stuck onto the carrier 1, thus forming the wafer composite 10.

After the wafer composite 10 is completed, the etchant L for thinning is spin-coated on the semiconductor wafer 2 of the wafer composite by the etching apparatus shown in FIG. 5 as described in the previous embodiment. Here, while the wafer composite 10 is being rotated, $N_2$ gas, for instance, is continuously blown from below against the wafer composite. Since the semiconductor wafer 2 is overhanged from the carrier 1 as describe above, the $N_2$ gas is blown against the downward outer periphery of the main surface of the semiconductor wafer 2 without being blocked by this carrier 1.

After the thinning process is finished, the wafer composite is attached onto the dicing tape, and then the vacuum hole is opened so that the pressure in the hollow 6 can be restored to the atmospheric pressure. Accordingly, the suction force of the suction groove 11b to the semiconductor wafer 2 is lost, thus allowing the carrier 1 to be easily separated from the semiconductor wafer 2. Then, the semiconductor wafer 2 on the dicing tape is diced into individual semiconductor chips.

According to the semiconductor wafer 2 processing technique of this embodiment, since the wafer composite 10 is formed so that the semiconductor wafer 2 is overhanged from the carrier and since the etchant L for thinning is spin-coated on the semiconductor wafer while air is continuously blown from below against the wafer composite 10, the etchant L can be prevented from flowing around the peripheral side into the main surface, even though a large centrifugal force cannot be achieved because of spin-coating under a low revolution rate. Therefore, the circuit elements formed on the semiconductor wafer 2 can be protected from being damaged by the etchant.

Moreover, since the semiconductor wafer 2 is stuck by vacuum suction onto the carrier 1 to form the wafer composite 10, and since the reduced pressure in the hollow is restored to the atmospheric pressure after thinning so that the wafer 2 and the carrier 1 can be separated, the carrier 1 can be smoothly peeled off.

In addition, since the semiconductor wafer 2 is kept flat along the base 1a, the wafer 2 can be suppressed from warp.

It was previously described that the diameter of the wafer 2 may be smaller than or equal to that of the carrier 1 as is contrary to this embodiment. In this case, if the outer periphery of the main surface of the semiconductor wafer 2 is tightly and securely cemented to the carrier 1 without any gap, the etchant L can be prevented from flowing around the peripheral side into the main surface. Therefore, as in this embodiment, there is no need to spin-coat the etchant L while air is continuously blown against the wafer composite 10. Also, since the thin semiconductor wafer 2 is not overhanged from the carrier 1, it is easy to handle the wafer composite 10. Moreover, since the entire main surface of the semiconductor wafer 2 is covered by the carrier 1 so as to be shielded from the external atmosphere, the rear surface of the semiconductor wafer 2 can be etched to be thinned by the dipping system in which the wafer composite 10 itself is dipped in the etchant L, not by the spinning type etcher.

Figure 17:
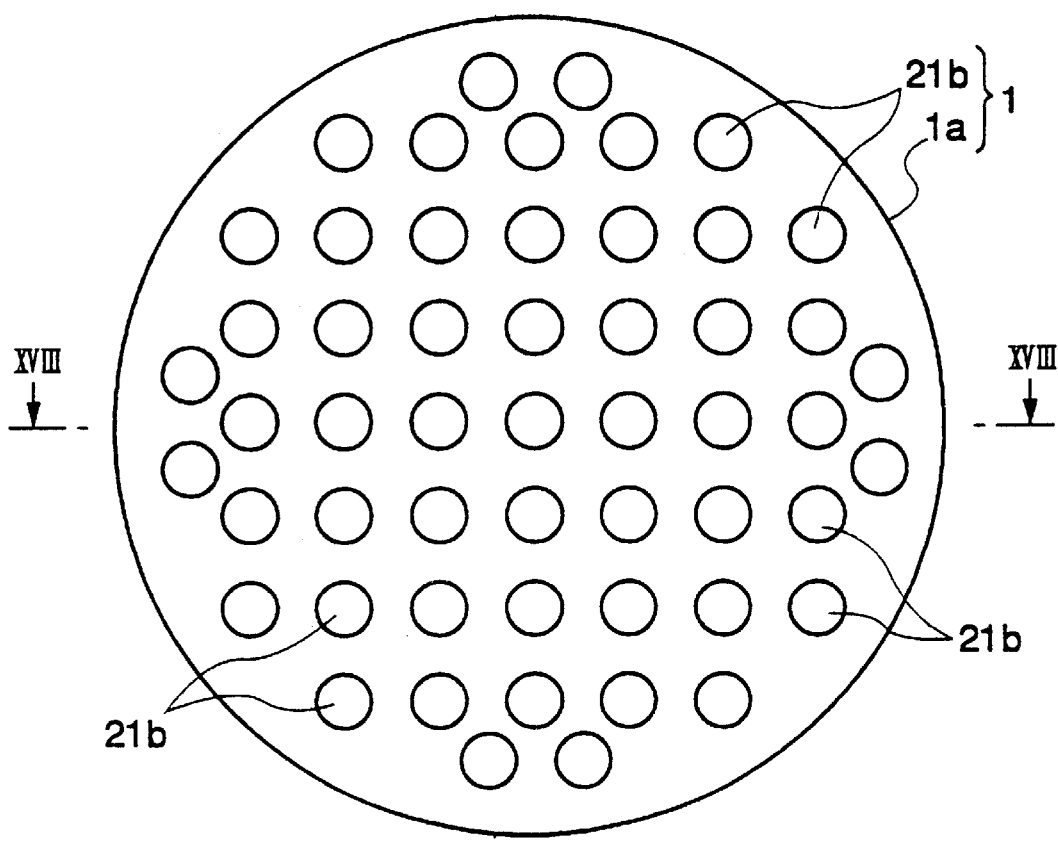
FIG. 17 is a plan view of the carrier used in the semiconductor wafer thinning process according to still another embodiment of the invention.
Figure 18:
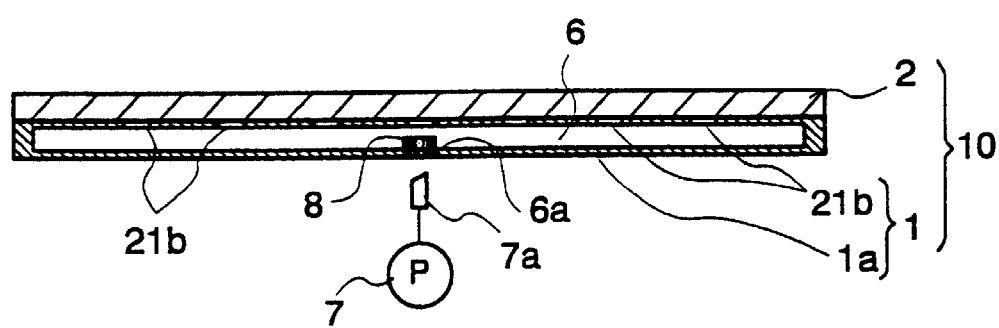
FIG. 18 is a cross-sectional view taken along a line XVIII—XVIII in FIG. 17.

FIG. 17 is a plan view of the carrier used in still another embodiment of the semiconductor thinning process according to the invention. FIG. 18 is a cross-sectional view taken along the line XVIII—XVIII in FIG. 17.

In this embodiment, suction holes 21b are provided in addition to the suction groove 11b given in the previous embodiment. In other words, the suction holes 21b are formed in one surface of the base 1a at a plurality of locations so as to be communicated with the vacuum hole 6a through which the hollow 6 is connected to the vacuum pump as does the suction groove 11b. The semiconductor wafer 2 is sucked by the vacuum pump 7. Therefore, separation of the semiconductor wafer 2 from the carrier 1 is made by restoration to atmospheric pressure.

The semiconductor wafer 2 may be combined with the carrier 1 to form the wafer composite 10 by the vacuum suction via a plurality of suction holes 21b thus formed.

Figure 19:
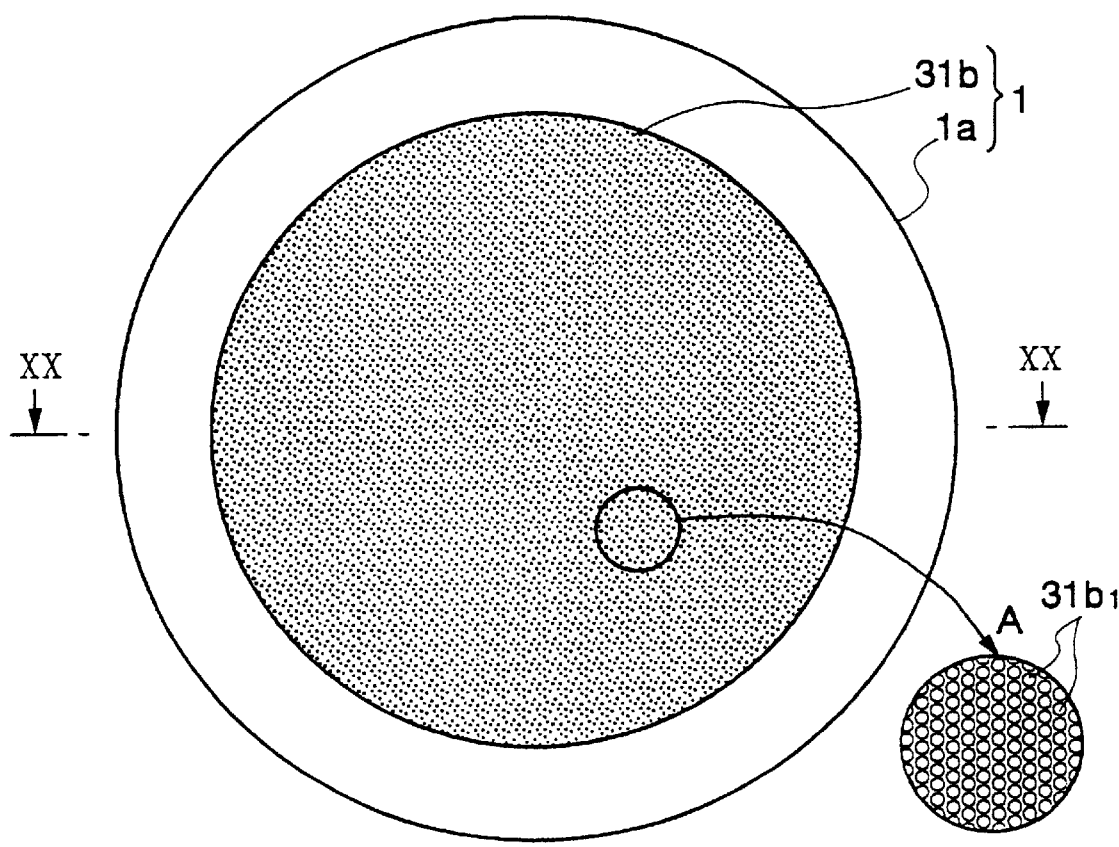
FIG. 19 is a plan view of the carrier used in the semiconductor wafer thinning process according to still another embodiment of the invention.
Figure 20:
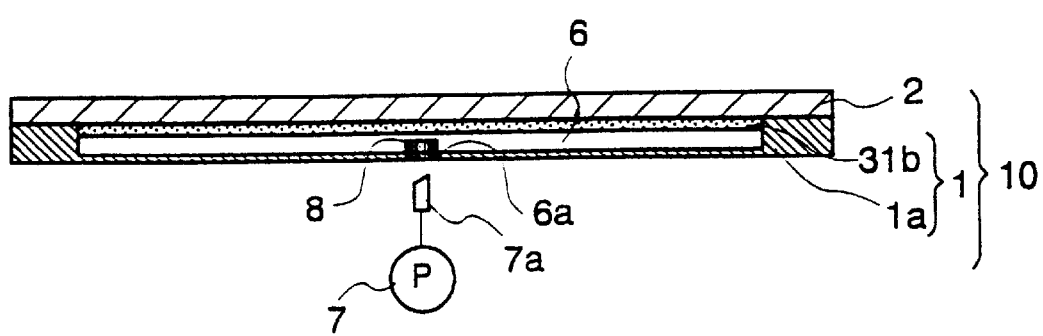
FIG. 20 is a cross-sectional view taken along a line XX—XX in FIG. 19.

FIG. 19 is a plan view of the carrier used in still another embodiment of the semiconductor wafer thinning process according to the invention. FIG. 20 is a cross-sectional view taken along the line XX—XX in FIG. 19.

In this embodiment, a porous member 31b made of resin or metal is provided on one side of the base 1a instead of the suction groove 11b given in the previous embodiment. As illustrated in FIG. 19 at A, the porous member 31b has a number of small holes $31b_1$ formed, which are communicated with the vacuum hole 6a through the hollow 6 as shown in FIG. 20. The semiconductor wafer 2 is stuck to the carrier 1 by the vacuum suction via the small holes $31b_1$ of the porous disk 31b, and separated from the carrier by restoration to atmospheric pressure.

Thus, the semiconductor wafer 2 can also be combined with the carrier 1 to form the wafer composite 10 by the vacuum suction via the porous member 31b.

Figure 21:
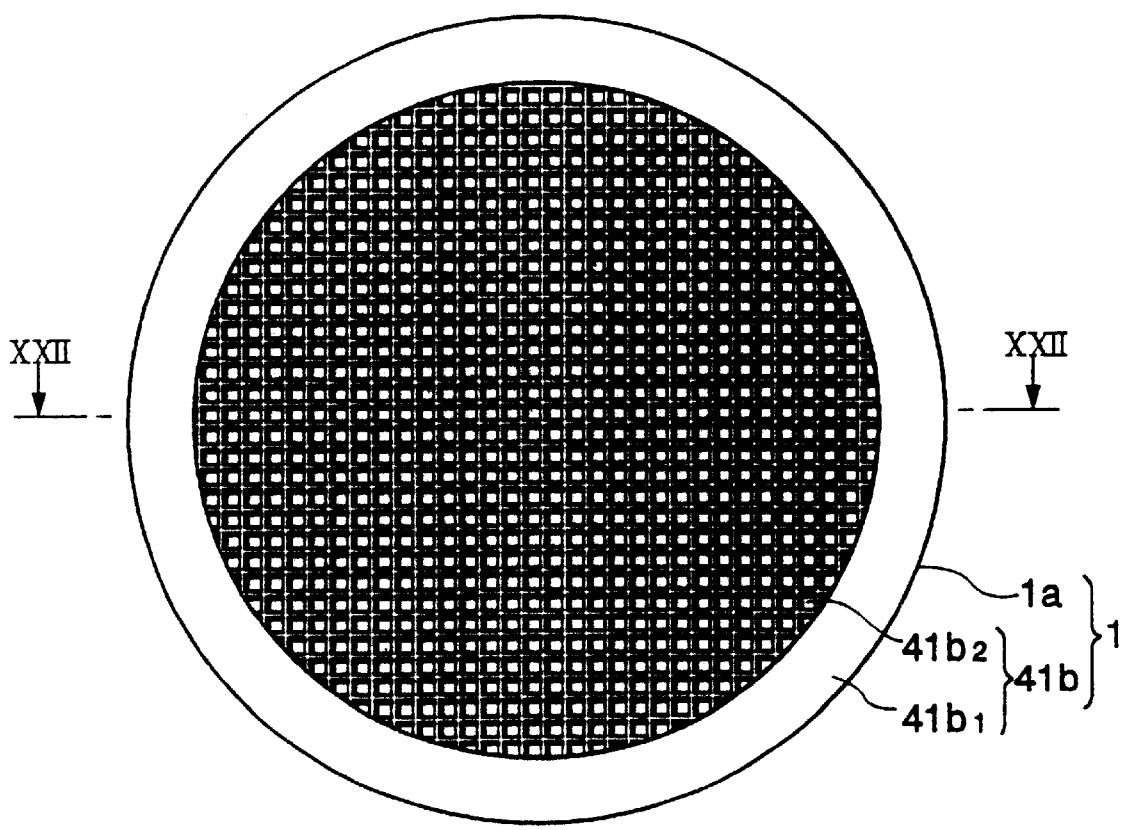
FIG. 21 is a plan view of the carrier used in the semiconductor wafer thinning process according to still another embodiment of the invention.
Figure 22:
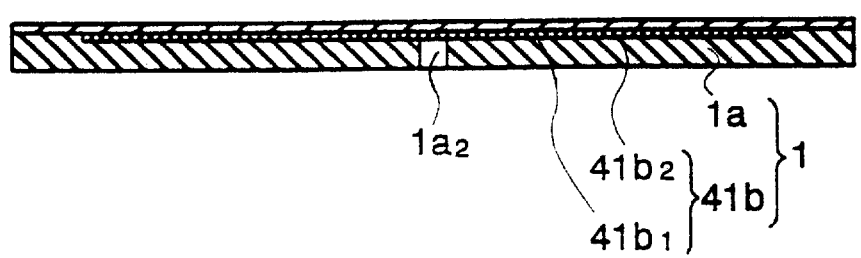
FIG. 22 is a cross-sectional view taken along a line XXII—XXII in FIG. 21.
Figure 28:
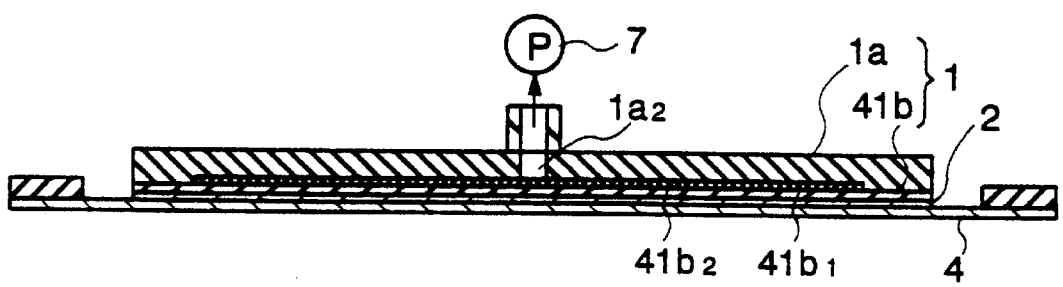
FIG. 28 shows another part of the semiconductor wafer processing procedure using the carrier of FIG. 21 after the operation of FIG. 27.
Figure 29:
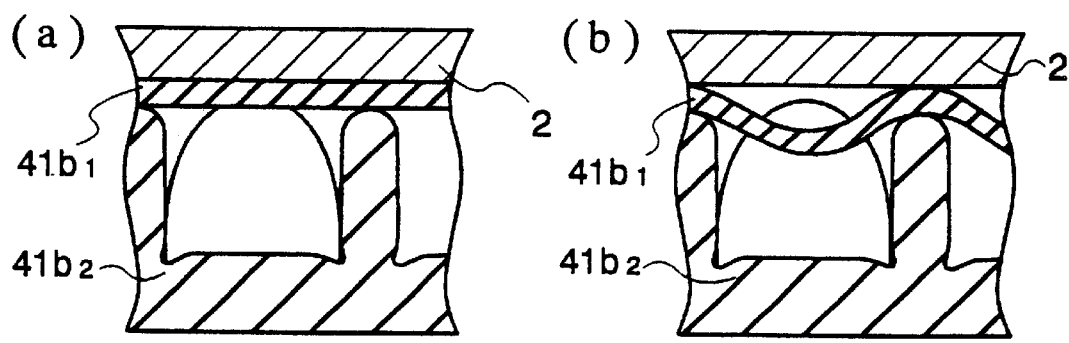
FIG. 29(a) illustrates the state of the bonded semiconductor wafer and carrier.
FIG. 29(b) illustrates the state of the separated semiconductor wafer and carrier.

FIG. 21 is a plan view of the carrier used in still another embodiment of the semiconductor wafer thinning process according to the invention. FIG. 22 is a cross-sectional diagram taken along the line XXII—XXII in FIG. 21. FIGS. 23 to 28, and FIG. 30 are flow diagrams of the semiconductor wafer working process using the carrier shown in FIG. 21. FIG. 29 are diagrams useful for explaining the sucked state and separated state between the semiconductor wafer and the carrier. In this embodiment, because the adhesion sheet $41b_1$ illustrated in FIG. 22 is transparent, a net (exfoliation) $41b_2$ is seen through this adhesion sheet $41b_1$.

The adhesion member $41b$ of the carrier 1 in this embodiment is formed of the net $41b_2$ having a plurality of small recesses and its surface flush with that of the base $1a$, and the adhesion sheet $41b_1$ interposed between the net $41b_2$ and the semiconductor wafer 2 (FIGS. 23 to 30) so as to stick the wafer 2 to the base $1a$. The adhesion sheet $41b_1$ is made of a flexible, surface-smooth material such as a curable liquid polymer, namely, gelled silicone containing a curable component. Therefore, when a solid substance having a smooth surface such as the semiconductor wafer 2 is placed on the adhesion sheet $41b_1$, the entire surfaces of the wafer 2 and adhesion sheet $41b_1$ are made in intimate contact with each other and fixed by interfacial adhesion. In place of the net $41b_2$, the base $1a$ may have an irregular surface formed as an exfoliative portion.

A through-hole $1a_2$ is formed in the base $1a$ at its center, and it is connected to the vacuum pump when the semiconductor wafer 2 and the carrier 1 are separated as described later.

The procedure of the semiconductor wafer 2 thinning process using the carrier 1 will be described below. The procedure in this embodiment is substantially the same as that in the previous embodiment mentioned first, and thus like elements will be described briefly.

Figure 23:
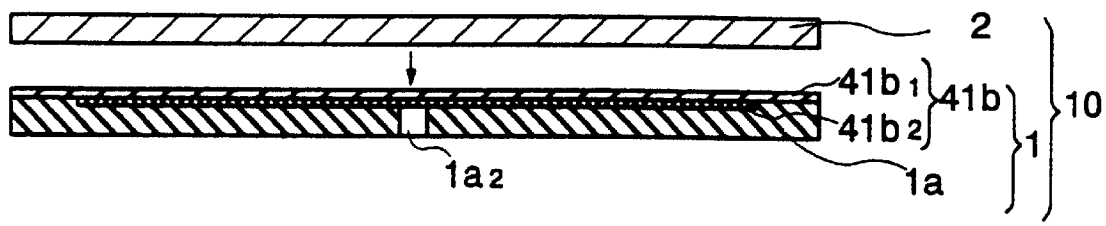
FIG. 23 shows part of the semiconductor wafer processing procedure using the carrier of FIG. 21.
Figure 24:
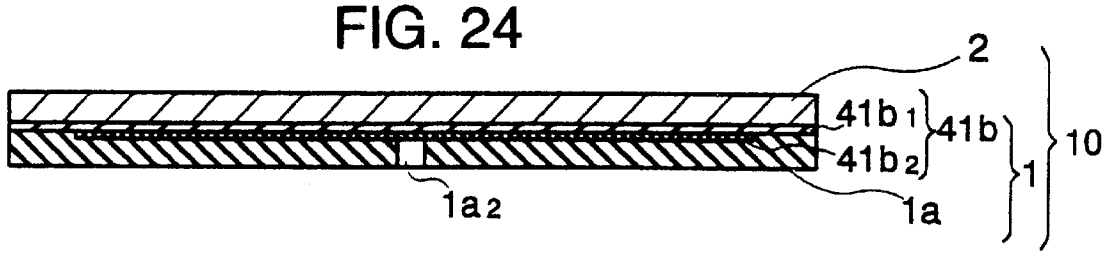
FIG. 24 shows another part of the semiconductor wafer processing procedure using the carrier of FIG. 21 after the operation of FIG. 23.
Figure 25:
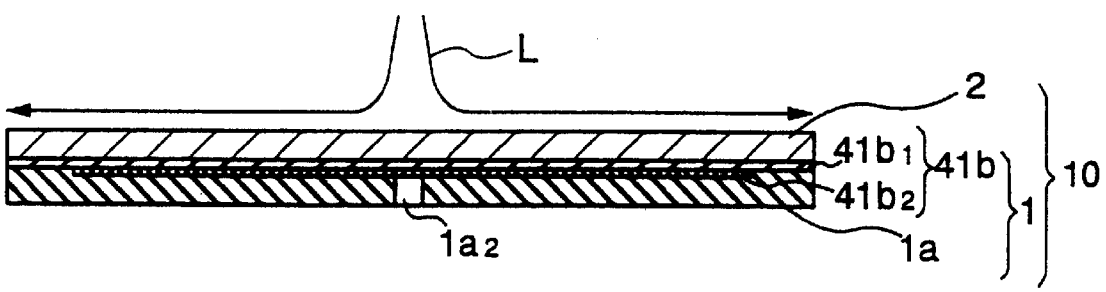
FIG. 25 shows another part of the semiconductor wafer processing procedure using the carrier of FIG. 21 after the operation of FIG. 24.
Figure 26:
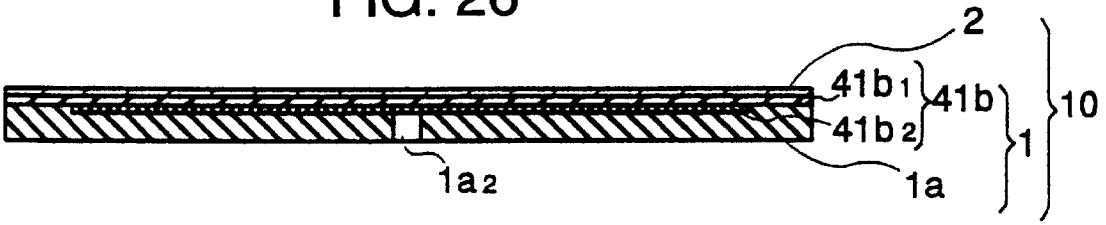
FIG. 26 shows another part of the semiconductor wafer processing procedure using the carrier of FIG. 21 after the operation of FIG. 25.
Figure 27:
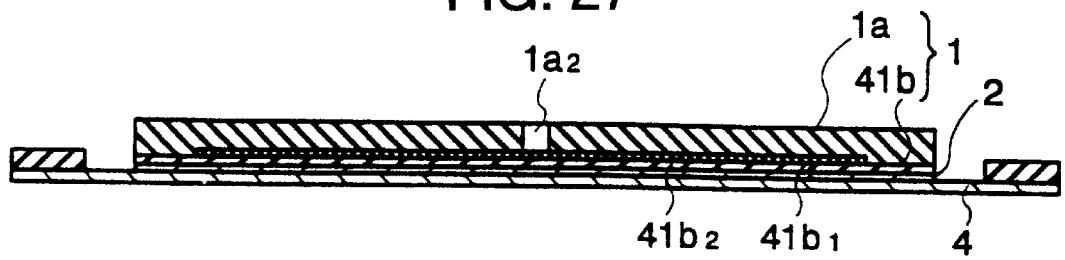
FIG. 27 shows another part of the semiconductor wafer processing procedure using the carrier of FIG. 21 after the operation of FIG. 26.
Figure 30:
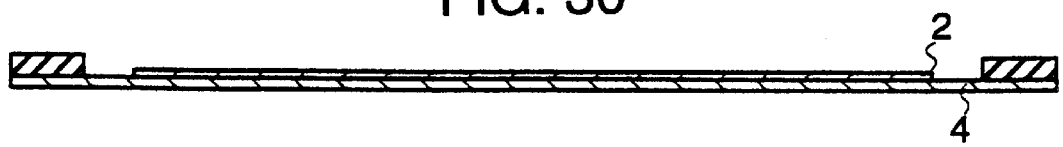
FIG. 30 shows another part of the semiconductor wafer processing procedure using the carrier of FIG. 21 after the operation of FIG. 28.

First, as illustrated in FIG. 23, the semiconductor wafer 2 thinned to a certain thickness is pressed against the carrier 1. At this time, since the presence of looseness due to extension and slack in the adhesion sheet $41b_1$ will cause the semiconductor 2 to vibrate when it is rotated, the adhesion sheet $41b_1$ is required to be completely in contact with the surface of the base $1a$ and net $41b_2$. When a light weight is loaded uniformly on the entire surface of the semiconductor wafer 2, an interfacial force is exerted between the semiconductor wafer 2 and the adhesion sheet $41b_1$, causing the semiconductor wafer 2 to stick to the carrier 1, so that the wafer composite 10 can be formed (FIG. 24). This wafer composite 10 is loaded in the etching apparatus shown in FIG. 5, and the etchant L is spin-coated on the rear surface of the semiconductor wafer 2 of the wafer composite 10 with the semiconductor wafer side up (FIG. 25), thereby thinning it (FIG. 26). Then, after rinsing and drying, the wafer composite 10 is attached to the dicing tape 4 (FIG. 27), and the through-hole $1a_2$ of the base $1a$ is connected to the vacuum pump 7 so that the semiconductor wafer is sucked by vacuum (FIG. 28). Thus, the semiconductor wafer 2 and adhesion sheet $41b_1$ securely fixed face to face as illustrated in FIG. 29 at ($a$) are shifted to, as it were, the point-contact state since the adhesion sheet $41b_1$ is pulled into the small recesses of the net $41b_2$ as shown in FIG. 29 at ($b$). After the interfacial force between both is extremely reduced by this shift, the carrier 1 is separated from the semiconductor wafer 2. Thus, the thinned semiconductor wafer 2 remains stuck to the dicing tape 4 (FIG. 30). Thereafter, the semiconductor wafer 2 is diced into individual semiconductor chips.

According to the semiconductor wafer 2 processing technique of this embodiment, since the pressure in the surroundings of the net $41b_2$ is reduced after thinning, thus causing the adhesion sheet $41b_1$ to be pulled into the small recesses of the net $41b_2$ so that the semiconductor wafer 2 and the adhesion sheet $41b_1$ are brought into the point-contact state under which the interfacial force is reduced to allow the carrier 1 to be separated from the semiconductor wafer 2, the carrier 1 can be more easily peeled off from the semiconductor wafer 2, and thus the thin semiconductor wafer 2 can be mass-produced with high productivity.

In addition, since the semiconductor wafer 2 can always be kept flat along the base $1a$, it is possible to suppress the warp of the semiconductor wafer 2.

FIGS. 31 to 37 are flow diagrams of the semiconductor wafer thinning process of still another embodiment according to the invention.

Figure 31:
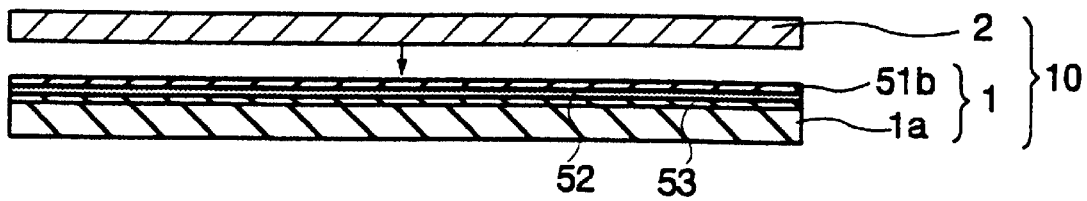
FIG. 31 shows part of the semiconductor wafer processing procedure according to still another embodiment of the invention.

The carrier 1 depicted in FIG. 31 has a transparent sheet tape 52 attached to the base $1a$ with a transparent adhesive 53. On the surface of the sheet tape 52, is coated an adhesive of which the adhesion is reduced or lost by irradiating UV (ultraviolet) light 54 (FIG. 36), or a removable UV cure-type adhesive (adhesive member) $51b$. Moreover, the base $1a$ is made of a transparent or semitransparent material through which UV light 54 can penetrate, such as acrylic acid resin, or a material having transparency.

The procedure of the semiconductor wafer thinning process using this carrier 1 will be described below. The procedure of this embodiment is substantially the same as that of the embodiment mentioned first, and thus like elements will be described briefly.

Figure 32:
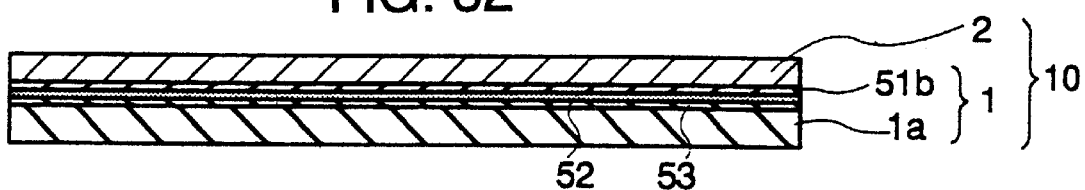
FIG. 32 shows another part of the procedure after the operation of FIG. 31.
Figure 33:
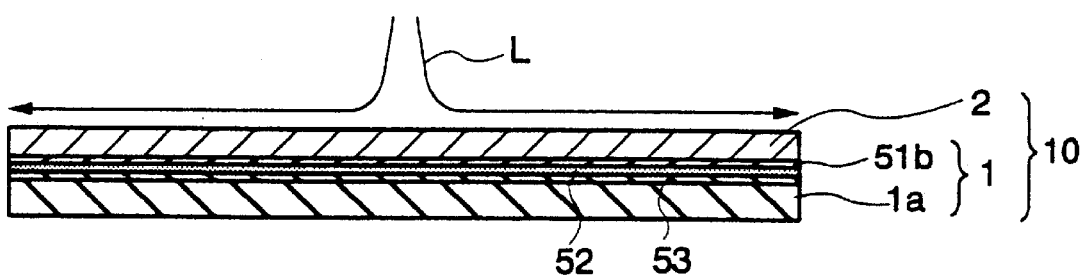
FIG. 33 shows another part of the procedure after the operation of FIG. 32.
Figure 34:
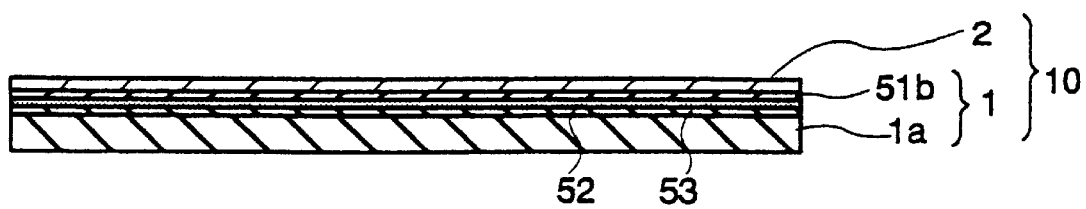
FIG. 34 shows another part of the procedure after the operation of FIG. 33.
Figure 35:
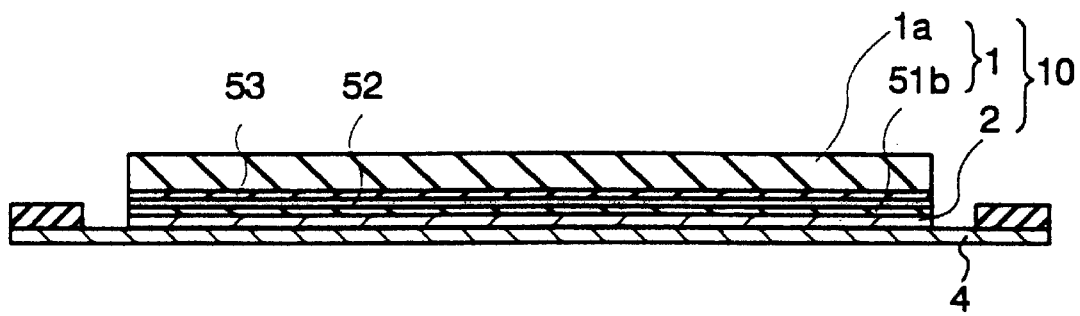
FIG. 35 shows another part of the procedure after the operation of FIG. 34.
Figure 36:
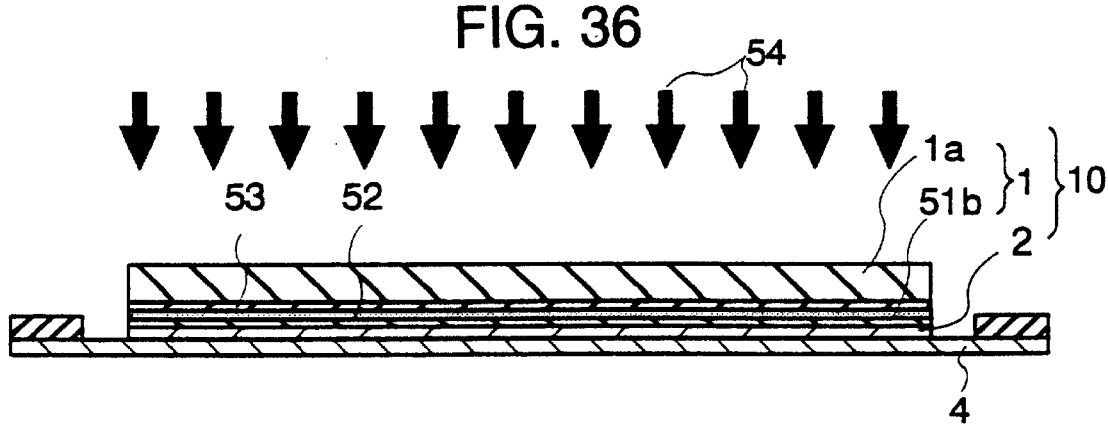
FIG. 36 shows another part of the procedure after the operation of FIG. 35.
Figure 37:
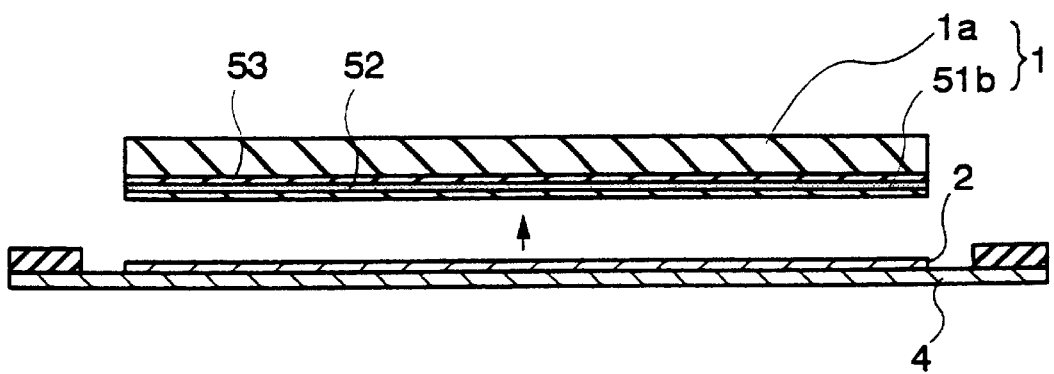
FIG. 37 shows another part of the procedure after the operation of FIG. 36.

First, the semiconductor wafer 2 thinned to a certain thickness is pressed against the UV cure-type adhesive $51b$ coated surface of the carrier 1 as illustrated in FIG. 31. When a light weight is loaded uniformly on the entire surface of the semiconductor wafer 2, the UV cure-type adhesive $51b$ is pressed by the semiconductor wafer 2, thus making the wafer 2 fixed to the carrier 1 to form the wafer composite 10 (FIG. 32). Then, the wafer composite 10 is loaded in the etching apparatus in such a manner that the rear surface of the semiconductor wafer 2 is placed up, and the semiconductor wafer is thinned by dropping the etchant L on the rear surface of the wafer 2 while it is being spun (FIGS. 33 and 34). After rinsing and drying, the wafer composite 10 is attached to the dicing tape 4 (FIG. 35), and UV light 54 is irradiated on the wafer composite 10 through the base $1a$ (FIG. 36). The irradiated UV light 54 penetrates the transparent base $1a$, sheet tape 52, and adhesive 53 and reaches the UV cure-type adhesive $51b$. Therefore, adhesion of the UV cure-type adhesive $51b$ is reduced by the UV light 54. At this time, the carrier 1 is pulled away from the semiconductor wafer 2, and thus the thinned semiconductor wafer 2 stays stuck to the dicing tape 4 (FIG. 30). Thereafter, the semiconductor wafer 2 is diced into individual semiconductor chips. In this case, the dicing tape 4 may be made of a material of which the adhesion can be reduced by the irradiation of UV light. Thus, if UV light is irradiated on the semiconductor wafer when the semiconductor chips after dicing are picked up, the operation is easy.

According to the semiconductor wafer 2 processing technique of this embodiment, the peeling-off operation can be performed with ease, since UV light 54, after thinning, is irradiated on the UV cure-type adhesive $51b$ used as an adhesive for bonding the semiconductor wafer 2 and the base $1a$, thus reducing its adhesion so that the carrier 1 can be peeled off from the semiconductor wafer 2.

In addition, since the adhesion between the carrier 1 and the semiconductor wafer 2 is reduced by the irradiation of UV light 54, there is no heat effect on a member, such as the dicing tape 4, to which the semiconductor wafer 2 is transferred after thinning, and thus it is possible to increase the freedom in the semiconductor production process design.

Moreover, since the thickness of the wafer composite 10 can be decreased by use of UV cure-type adhesive 51b, the wafer composite 10 can be handled like the normal-thickness semiconductor wafer without particular care to the small thickness.

Also, since the semiconductor wafer 2 can always be kept flat along the base 1a, it is possible to suppress the warp of the semiconductor wafer 2.

Figure 38:
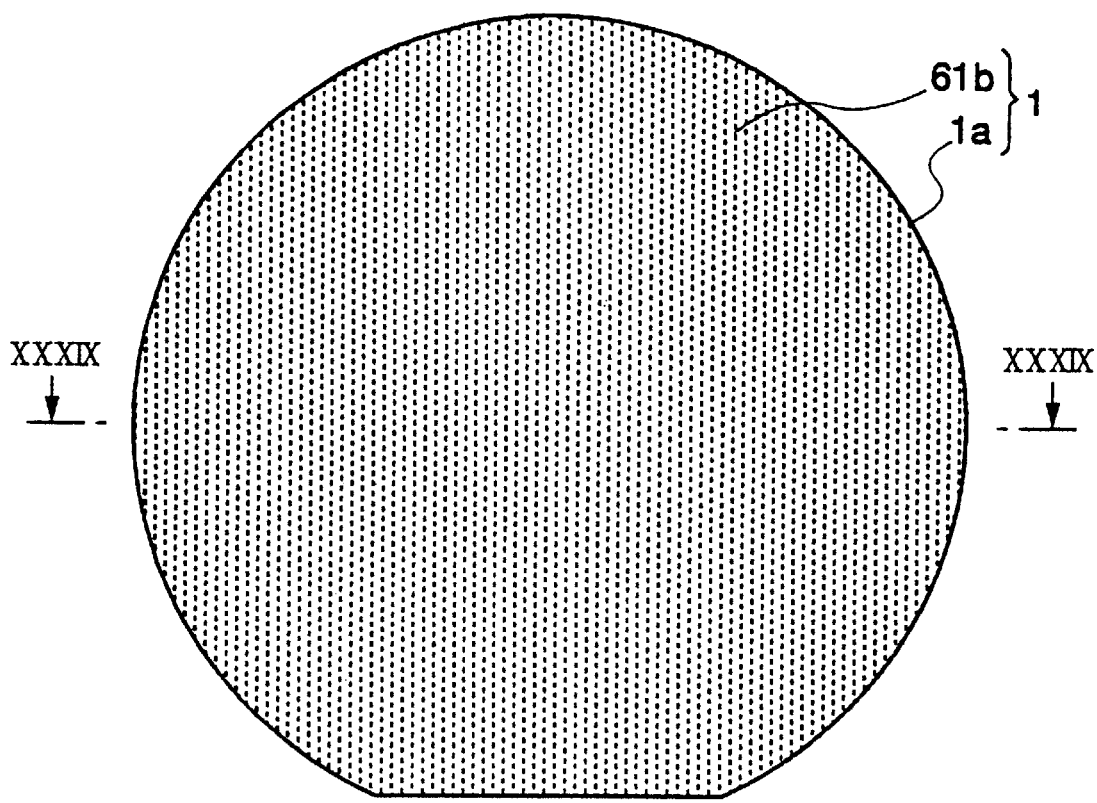
FIG. 38 is a plan view of the carrier used in the semiconductor wafer thinning process according to still another embodiment of the invention.
Figure 39:
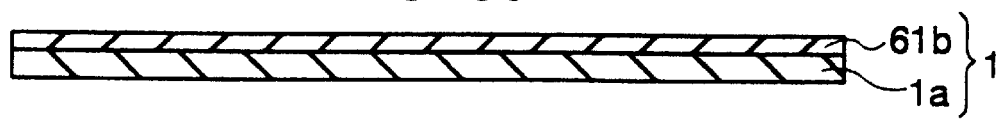
FIG. 39 is a cross-sectional view taken along a line XXXIX—XXXIX in FIG. 38.

FIG. 38 is a plan view of the carrier used in the semiconductor wafer thinning process of still another embodiment according to the invention. FIG. 39 is a cross-sectional view taken along the line XXXIX—XXXIX in FIG. 38.

The carrier 1 in this embodiment has the base 1a made of a PET film with a thickness of, for example, 188 μm, and a temperature activation type adhesive (adhesive member) 61b, coated on the base 1a, of which the adhesion is reduced or lost at a low temperature of 0° C. to 5° C. The base 1a may be made of PET film of which the thickness is, for example, 100 μm or 250 μm, or made of, for example, plastic or glass plate other than PET film. The temperature activation type adhesive 61b used is of the cool-off type in which the peel strength per 25-mm width is 35 gf to 150 gf at a temperature of 10° C. to 90° C. and is reduced to 0 gf at a temperature of, about 0° C. to 5° C. However, another type may be used in which the temperature activation point is as high as about 15° C. depending on the environment in which it is used. The temperature activation type adhesive 61b in this specification is an adhesive of which the adhesion is reduced or lost by temperature change, and it includes the cool-off type in which the adhesion is reduced at a low temperature as in this embodiment, and a warm-off type of which the adhesion is reduced at a high temperature.

In the semiconductor wafer thinning process using this carrier 1, first, the semiconductor wafer is attached onto the carrier 1 at normal temperature to form the wafer composite, and the semiconductor wafer is thinned by the same etching process as in the previous embodiments. Then, the wafer composite is stuck on the dicing tape so that the adhesive surface adheres to the semiconductor wafer. Thereafter, the wafer composite on the tape is left in a low-temperature environment such as a refrigerator for ten minutes so that the wafer composite is cooled to, for example, 3° C. Since the temperature activation type adhesive 61b is of the cool-off type in which the peel strength is reduced to about 0 gf at a temperature of 0° C. to 5° C. together with great reduction of the adhesion, the carrier 1 can be easily peeled off from the semiconductor wafer when the wafer composite is cooled to 3° C.

While the temperature activation type adhesive 61b used in this embodiment is of the cool-off type in which the adhesion is reduced at a low temperature, it may be of the warm-off type in which the adhesion is reduced at a high temperature within a temperature range in which the base 1a and the dicing tape are not affected by heat. In addition, if the dicing tape is made of a UV tape of which the adhesion is reduced by the irradiation of UV light, the heat effect can be completely eliminated.

According to the semiconductor wafer thinning technique of this embodiment, the peeling-off operation can be easily performed since the carrier 1 using the temperature activation type adhesive 61b as a bonding agent is peeled off from the semiconductor wafer when the adhesion is reduced by temperature change. In addition, since the carrier 1 can be repeatedly used, the thinned semiconductor wafer can be mass-produced at low cost.

Moreover, since the wafer composite can be made thin by using PET film for the base 1a, it can be handled like the normal-thickness semiconductor wafer. Also, since the cost can be reduced, the carrier 1 is disposable.

Since the film-shaped base 1a can be peeled off from the semiconductor wafer, the separation is easier than a plate-like and solid material. In addition, a protective tape for BG (back grinding) before etching for thinning can be used for the base 1a.

Also, since the semiconductor wafer is always kept flat along the base 1a, the warp of the semiconductor wafer can be suppressed even by the carrier 1 of this embodiment.

Figure 40:
FIG. 40 is a cross-sectional view of the carrier used in the semiconductor wafer thinning process according to still another embodiment of the invention.

FIG. 40 is a cross-sectional diagram of the carrier used in the semiconductor wafer thinning process of still another embodiment according to the invention.

The base 1a of the carrier 1 according to this embodiment is made of pressed-hard fibrous fluororesin in place of the PET film described in the above embodiment. Thus, the bonding agent such as the temperature activation type adhesive 61b can enter into the gaps of the fluororesin by anchor effect so as to be surely coated on the base 1a. The bonding agent, or adhesive member may be the UV cure-type adhesive 51b mentioned in the above embodiments.

Thus, since the carrier 1 has its base 1a made of fluororesin having a feature of resistance to acid, it is possible to use various bonding agents such as the temperature activation type adhesive 61b that has low adhesion to the base 1a.

Figure 47:
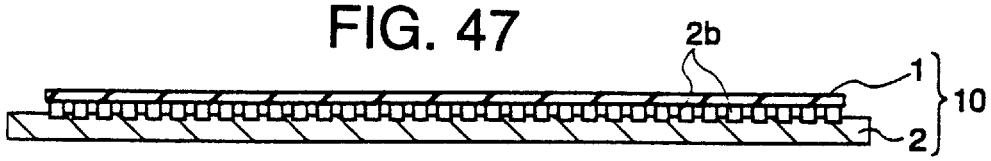
FIG. 47 shows another part of the procedure following the operation of FIG. 46.
Figure 48:
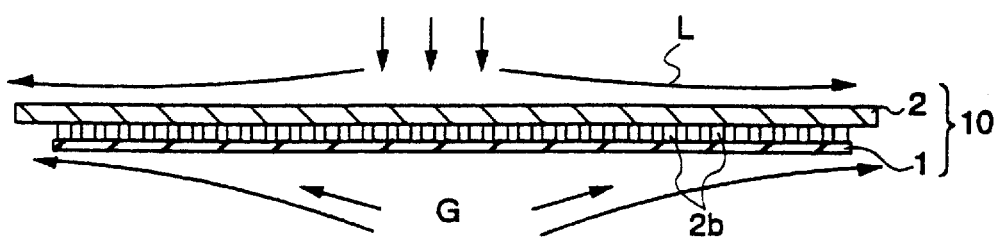
FIG. 48 shows another part of the procedure following the operation of FIG. 47.
Figure 54:
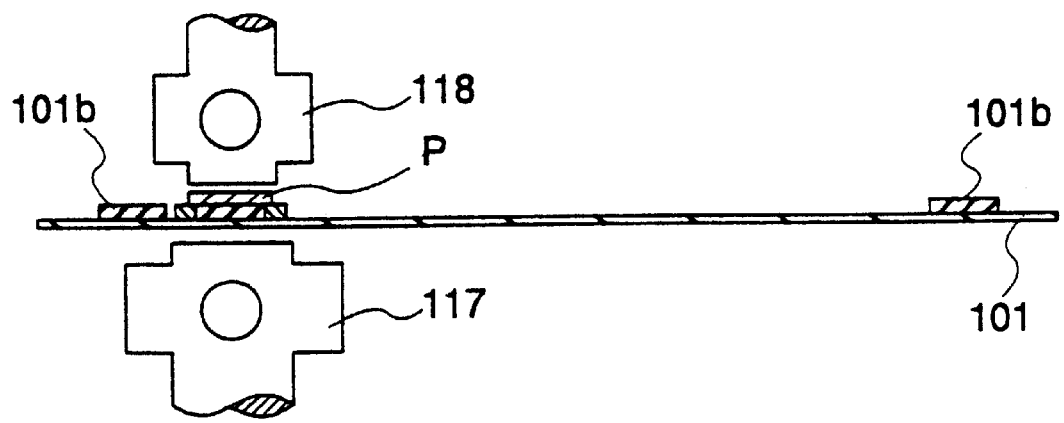
FIG. 54 shows another part of the procedure following the operation of FIG. 53.
Figure 55:
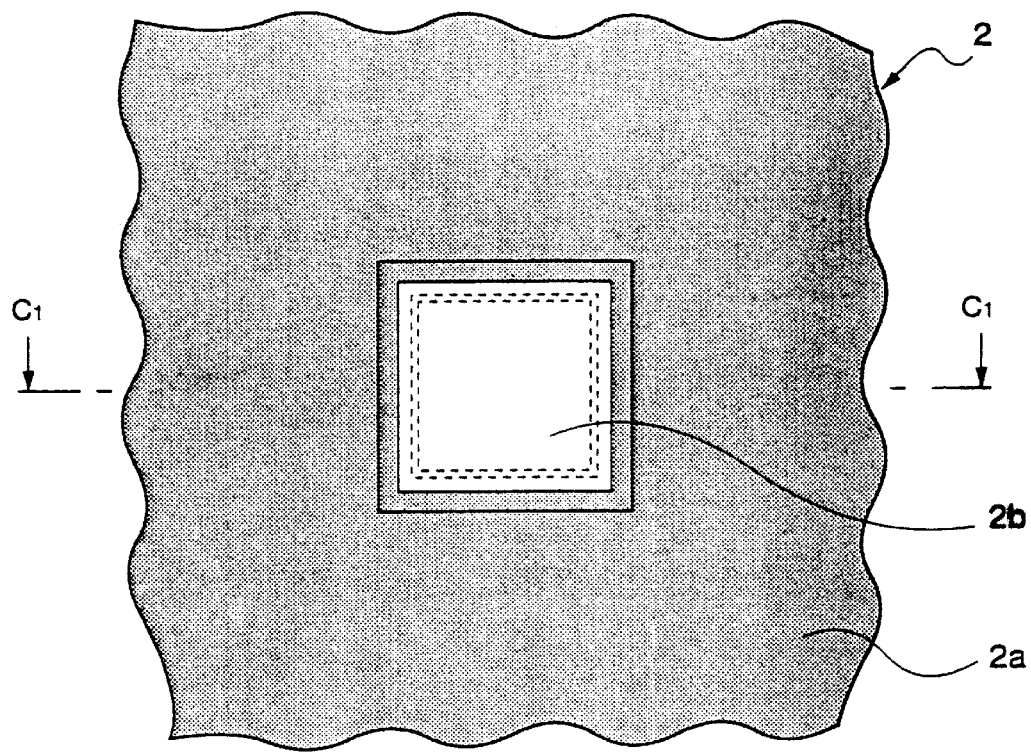
FIG. 55 is an enlarged plan view of the chip electrode portion of the semiconductor wafer of FIG. 41.
Figure 56:
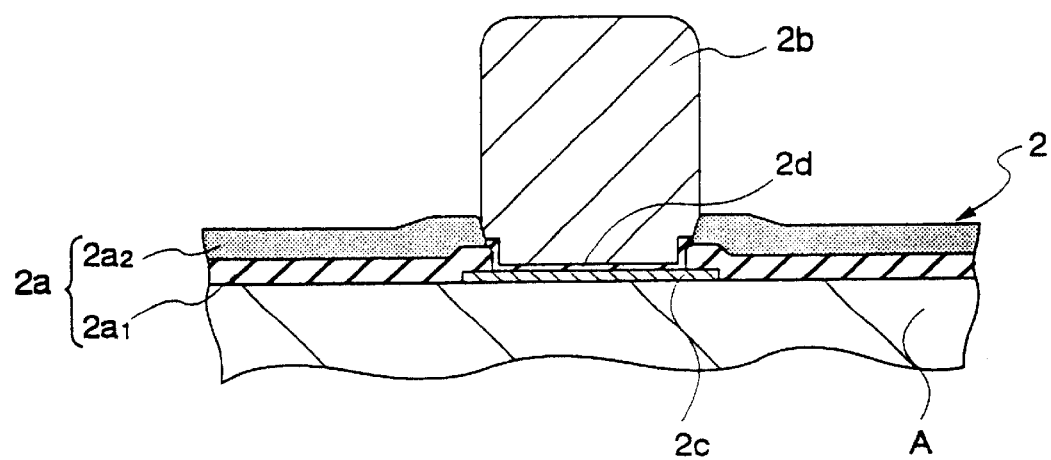
FIG. 56 is a cross-sectional view taken along a line $C_1$—$C_1$.
Figure 57:
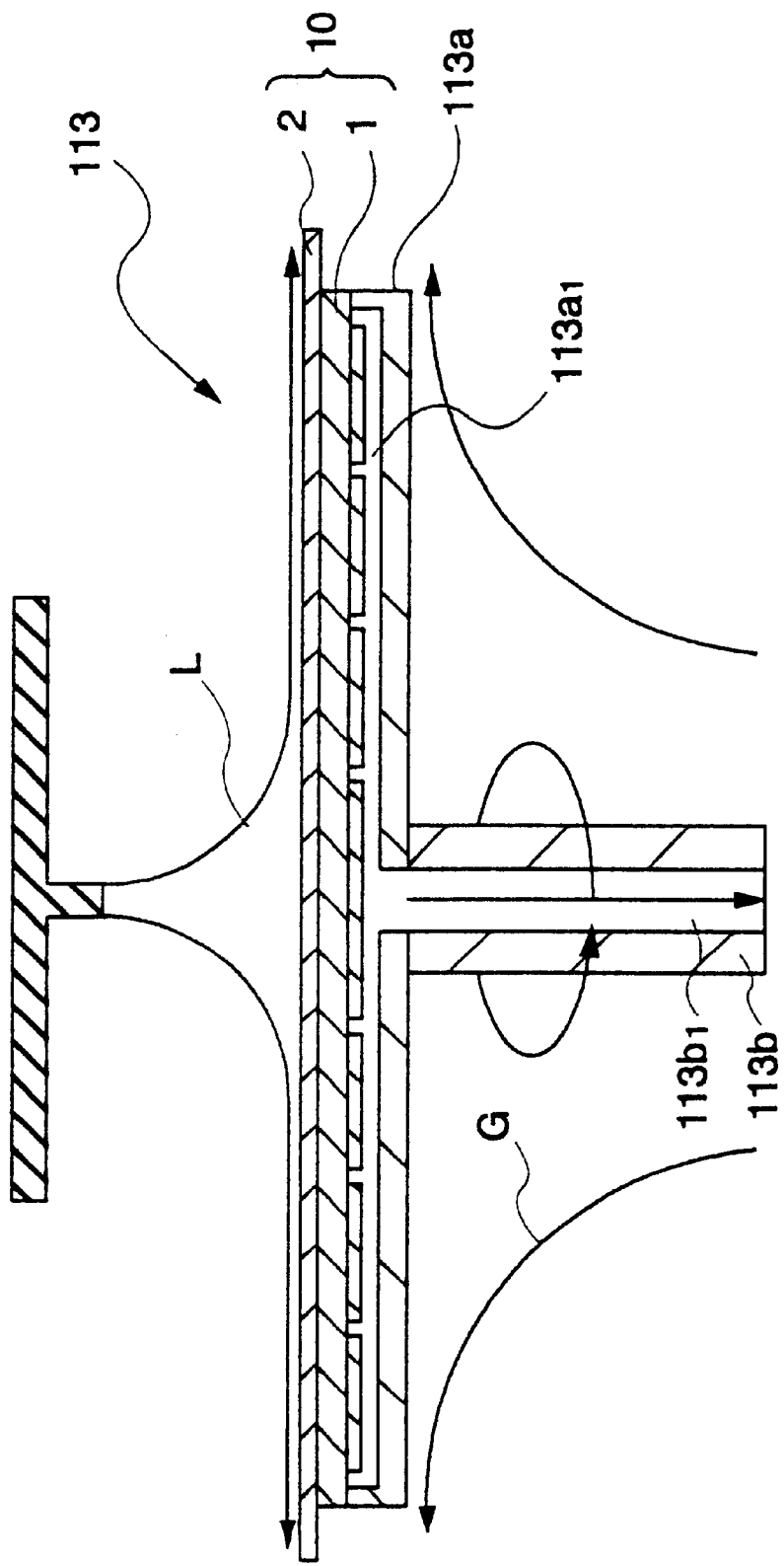
FIG. 57 shows the details of FIG. 48.
Figure 58:
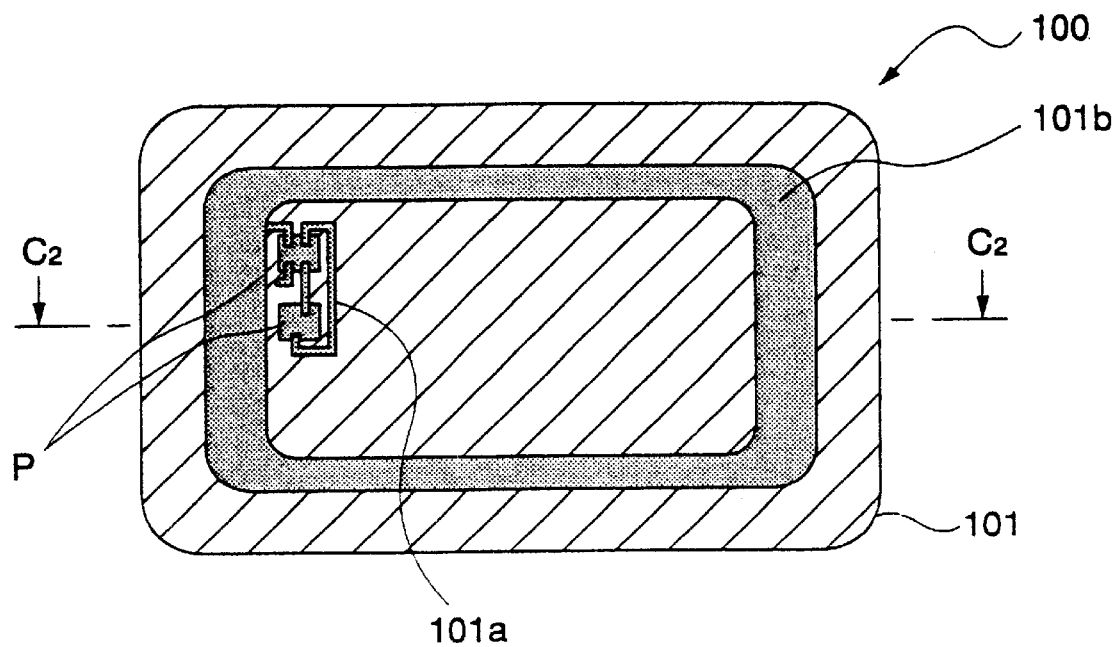
FIG. 58 is a plan view of the internal structure of the IC card produced according to this embodiment.
Figure 59:
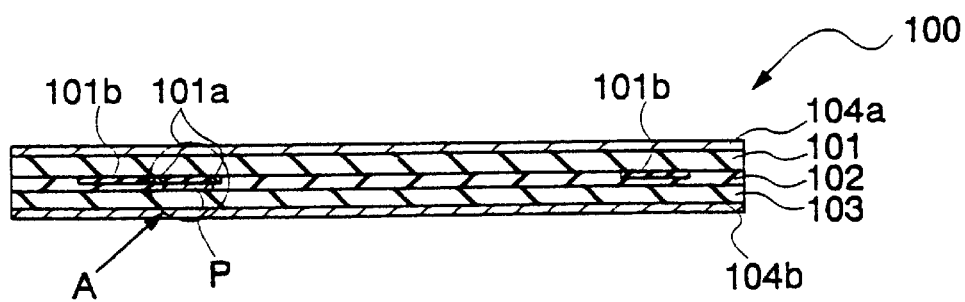
FIG. 59 is a cross-sectional view taken along a line $C_2$—$C_2$.
Figure 60:
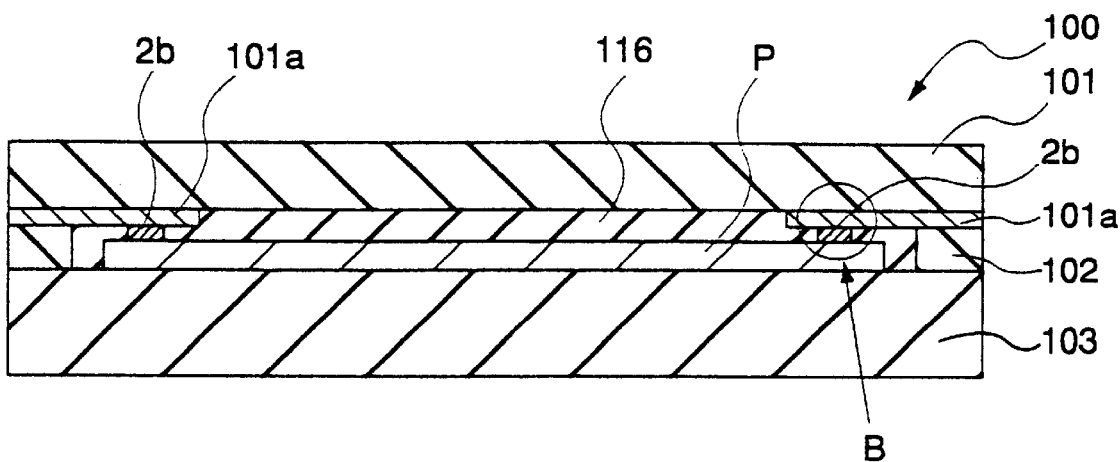
FIG. 60 is an enlarged cross-sectional view of portion A of FIG. 59.
Figure 61:
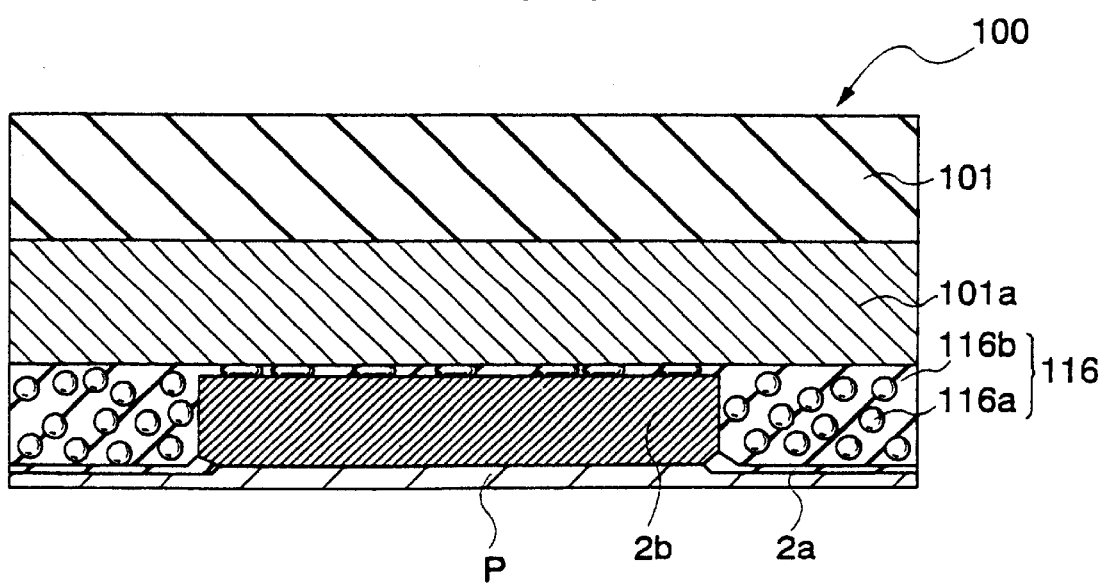
FIG. 61 is an enlarged cross-sectional view of portion B of FIG. 60.

FIGS. 41 to 54 are flow diagrams of an embodiment of the IC card production method according to the invention. FIG. 55 is an enlarged plan view of the electrode portion of a chip of the semiconductor wafer shown in FIG. 41. FIG. 56 is a cross-sectional diagram taken along the line $C_1$ to $C_1$ in FIG. 55, FIG. 57 shows the details of FIG. 48, and FIG. 58 is a plan view of the internal structure of the IC card produced according to this embodiment. FIG. 59 is a cross-sectional diagram taken along the line $C_2$ to $C_2$ in FIG. 58, FIG. 60 is an enlarged cross-sectional view of portion A in FIG. 59, and FIG. 61 is an enlarged cross-sectional view of portion B in FIG. 60.

Figure 41:
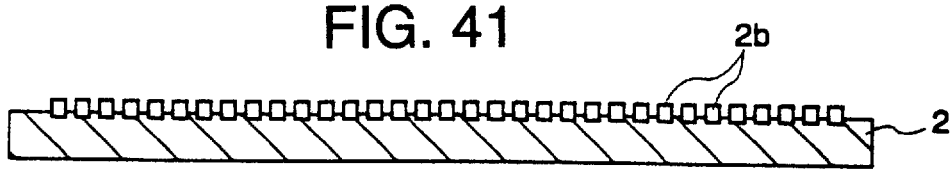
FIG. 41 shows part of the semiconductor wafer processing procedure according to still another embodiment of the invention.

In the IC production method of this embodiment, first, the semiconductor wafer 2 having circuit elements built in the main surface, or in which the so-called wafer process is already completed, is prepared as illustrated in FIG. 41. Therefore, a passivation film 2a (FIGS. 55 and 56) made of, for example, $Si_3N_4$ film is formed on the main surface to shield the circuit elements from the external atmosphere so that the characteristics of the elements can be stabilized. In the illustrated example, Au (gold) bumps 2b are formed on the chip electrodes by, for example, electrolytic plating or vacuum evaporation. Wiring conductors 101a (FIG. 58 and so on) on a card substrate 101 (FIG. 53 and others) which will be described later are electrically connected through the Au bumps 2b to the chips. In this case, the chip electrodes may be connected to the wiring conductors by wire bonding instead of the bumps. In addition, bumps made of other metal, such as Pb (phosphorus)/Sn (tin) bumps may be formed on the chip electrodes.

FIG. 55 shows the chip electrode of the semiconductor wafer 2. As illustrated, the passivation film 2a is deposited around the Au bump 2b on the chip. As shown in FIG. 56, or in the cross-sectional diagram taken along the line $C_1$—$C_1$ in FIG. 55, the passivation film 2a protecting the element region A is formed of two layers: an inorganic passivation film $2a_1$ as an underlayer and an organic passivation film $2a_2$ as an upper layer. The inorganic passivation film $2a_1$ is made of, for example, 1.2 μm-thick SiN (silicon nitride) and 0.6 μm-thick $SiO_2$ (silicon oxide), and the organic passivation film $2a_2$ is made of, for example, 2.3 μm-thick polyimide. On the element region A are formed, for example, an Al electrode conductor 2c of 0.8 μm-thickness, and an underbump metal 2d on the conductor 2c. The Au bump 2b of, for example, 20 μm-height is formed on this underbump metal 2d as a plated electrode. In this embodiment, the underbump metal 2d is made of Ti (titanium)/Pd (palladium) for increasing the adhesion and for metal diffusion protection. It may be made of other metal, for example, TiW (titanium-tungsten), Cr (chromium) or Cu (copper).

Figure 42:
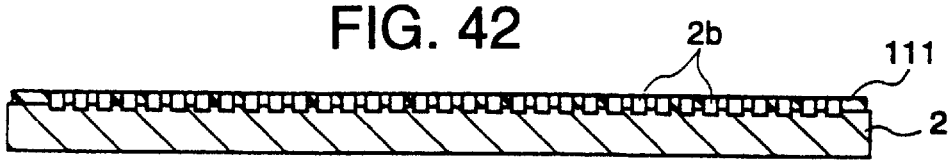
FIG. 42 shows another part of the procedure following the operation of FIG. 41.
Figure 43:
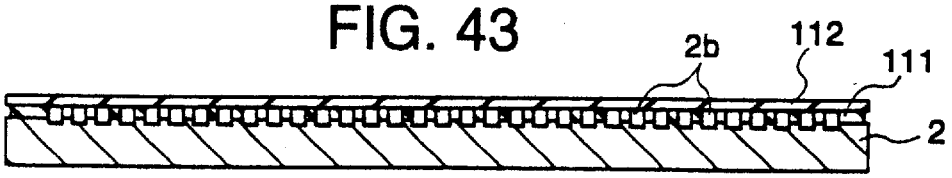
FIG. 43 shows another part of the procedure following the operation of FIG. 42.
Figure 44:
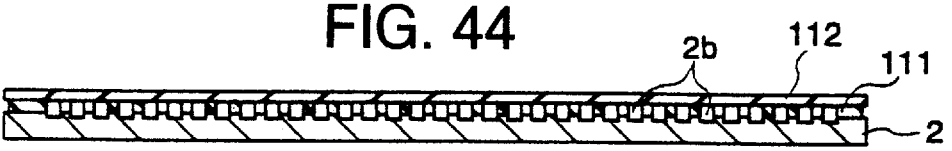
FIG. 44 shows another part of the procedure following the operation of FIG. 43.

Then, as shown in FIG. 42, a surface-protective resist 111 is coated on the main surface of the semiconductor wafer 2, and heated. In addition, as shown in FIG. 43, a BG tape 112 for rear surface grinding is attached on the main surface of the semiconductor wafer 2, and the rear side of the semiconductor wafer of, for example, 550 μm thickness is ground to a thickness of, for example, 150 μm as shown in FIG. 44. Since the resist 111 is coated on the main surface of the wafer, the surface of the semiconductor wafer 2 can be protected from contamination by dust in the BG process.

Figure 45:
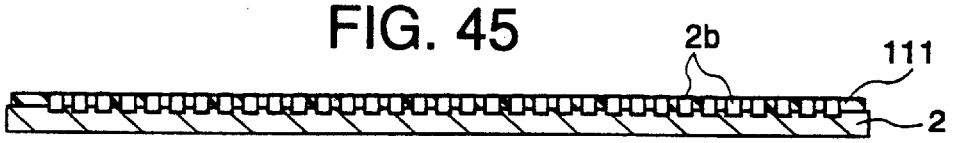
FIG. 45 shows another part of the procedure following the operation of FIG. 44.
Figure 46:
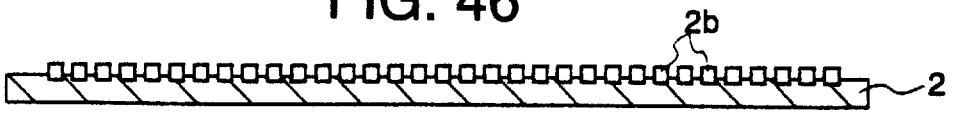
FIG. 46 shows another part of the procedure following the operation of FIG. 45.

After the semiconductor wafer 2 is thinned by the BG process, the BG tape 112 is peeled off as shown in FIG. 45, and then the resist 111 is removed as shown in FIG. 46.

The carrier 1 is prepared which has the base made of, for example, 250 μm-thick PET film and a normal adhesive (namely, not of the temperature activation type) coated on the base. Then, as shown in FIG. 47, the semiconductor wafer 2 with its rear side up is attached onto the carrier 1 to form the wafer composite 10. The carrier 1 may be of other types used in the above embodiments.

Here, the thickness of the adhesive of the carrier 1 is equal to the height of the Au bump 2b, or 20 μm. Therefore, the adhesive acts not only on the Au bump 2b, but also on the passivation film 2a on the wafer surface 20 μm lower than the Au bump 2b. Thus, all the carrier 1 is made in intimate contact with the semiconductor wafer 2 so that both can be prevented from being peeled off from each other. Since the adhesive adheres to the wafer surface even though its thickness exceeds the height of the Au bump 2b, the thickness of the adhesive may be larger than the height of the Au bump 2b (namely, equal to or larger than the height of the Au bump 2b).

If the wafer composite 10 is formed, the etchant L is dropped on the rear surface of the semiconductor wafer of the wafer composite with its wafer side up, and thinning it by spin etching to a thickness of, for example, 50 μm. Here, if the carrier were not attached to the semiconductor wafer, the semiconductor wafer would be warped when it is thinned to such a level because the rigidity of the semiconductor wafer 2 is reduced so that the residual stress in the passivation film 2a is released. Particularly when the compressing stress in SiN of inorganic passivation film $2a_1$ and the tension stress involved with the curing contraction of polyimide of organic passivation film $2a_2$ are released, the surface of the semiconductor wafer 2 would be warped to have irregularity. Thus, If the semiconductor wafer 2 is stuck to the carrier 1 to form the wafer composite 10 as in this embodiment, the base constituting the carrier 1 reinforces the semiconductor wafer 2 to compensate for the reduction of rigidity, and suppresses the release of the stress in the passivation film 2a, with the result that the thinned semiconductor wafer 2 is never warped. In this embodiment, as illustrated in FIG. 48, the diameter of the semiconductor wafer 2 is larger than that of the carrier 1 so that the semiconductor wafer 2 overhangs from the carrier 1. Thus, in order that the etchant L can be prevented from flowing around onto the main surface upon etching, $N_2$ gas (nitrogen gas) G, for instance, is blown against the lower side of the wafer composite 10.

For spin etching, an etcher 113 of, for example, pinless chuck type is used as illustrated in FIG. 57. Here, suction grooves $113a_1$ to be evacuated are formed in the surface of a working stage 113a at a plurality of locations. The suction grooves $113a_1$ are communicated with an evacuation groove $113b_1$ of an evacuation tube 113b connected to a vacuum pump. Since the suction grooves $113a_1$ are evacuated through the evacuation groove $113b_1$, the semiconductor wafer 2 is sucked and fixed to the working stage 113a. Therefore, although the semiconductor wafer 2 overhangs from the working stage 113a, it is not necessary to support its periphery by supporting pins. Thus, the etchant L can be properly dropped on right place without staying at unnecessary locations of supporting pins, any defects and dents can be prevented from locally occurring on the semiconductor wafer during etching.

Since the flowing-around problem of the etchant L mentioned above can be solved by strongly combining the semiconductor wafer 2 and the carrier 1 to be in intimate contact with each other, the diameter of the semiconductor wafer 2 may be made smaller than that of the carrier 1. In that case, the $N_2$ gas G is not necessary to be blown against the wafer composite 10, and also other etching system such as dipping system as described above can be employed for thinning the semiconductor wafer 2.

Figure 49:
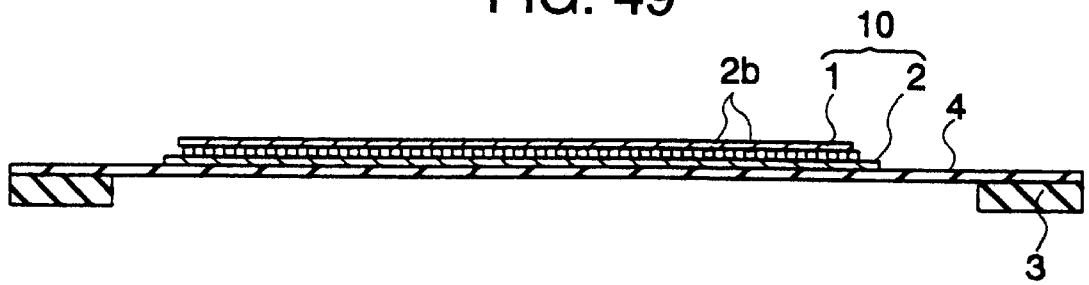
FIG. 49 shows another part of the procedure following the operation of FIG. 48.
Figure 50:
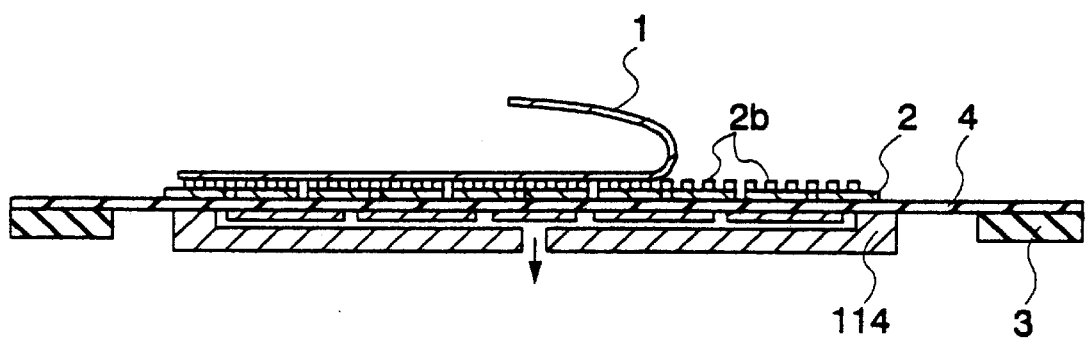
FIG. 50 shows another part of the procedure following the operation of FIG. 49.

After the semiconductor wafer 2 is thinned to a thickness of about 50 μm, the wafer composite 10 is attached to the dicing tape 4 with its semiconductor wafer 2 side up as shown in FIG. 49. Then, as illustrated in FIG. 50, the lower surface of the tape is fixed to a vacuum suction table 114, and the carrier 1 is peeled off from the semiconductor wafer 2 by peeling.

Figure 51:
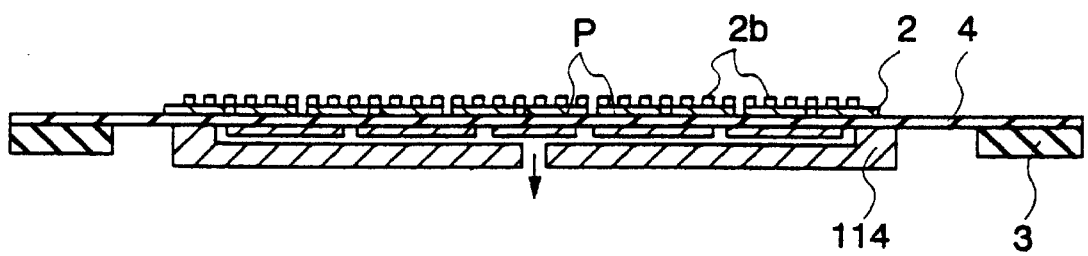
FIG. 51 shows another part of the procedure following the operation of FIG. 50.
Figure 52:
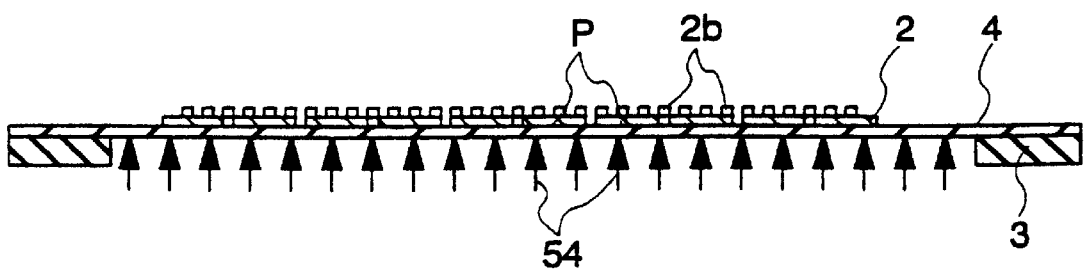
FIG. 52 shows another part of the procedure following the operation of FIG. 51.

Thereafter, as shown in FIG. 51, the semiconductor wafer 2 is divided into individual semiconductor chips P by, for example, full cutting. As shown in FIG. 52, UV light 54 is then irradiated on the UV adhesive of the dicing tape 4, thus reducing or loosing or losing the adhesion between the dicing tape 4 and the semiconductor wafer 2.

Figure 53:
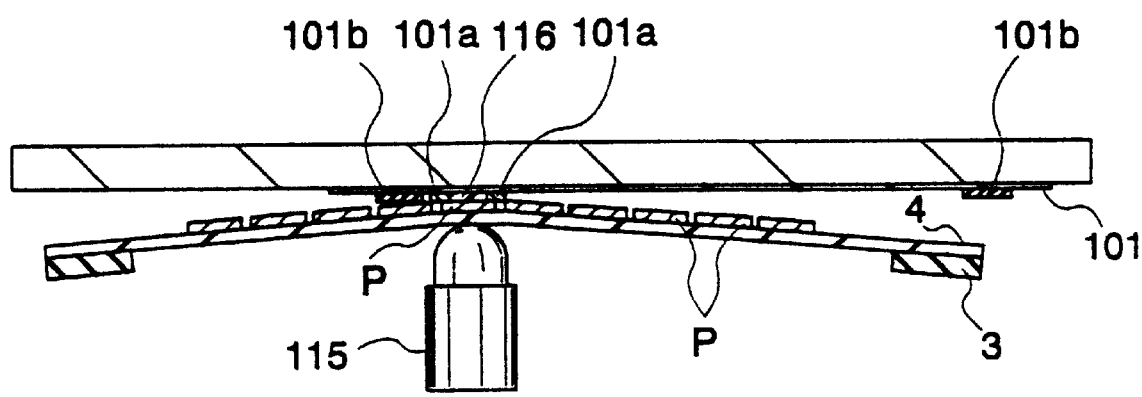
FIG. 53 shows another part of the procedure following the operation of FIG. 52.

As illustrated in FIG. 53, the card substrate 101 is set above the semiconductor chip P, and the semiconductor chip P is tentatively attached by a direct transfer system onto the card substrate 101 at a chip mounting location with the anisotropically conductive adhesive 116 being interposed therebetween. In the direct transfer system, the card substrate is stuck up from below by a sticking-up pin 114. Then, as shown in FIG. 54, the chip P is fully bonded to the card substrate by a bonding tool 118 with the lower side being supported by a pedestal 117. In this bonding process, the semiconductor chip is heated and pressed against the card substrate.

FIG. 58 illustrates a IC card 100 formed by the card substrate 101 with the semiconductor chips P thus mounted. The IC card 100 is a wireless type IC card assembled by laminate system. The IC card has its card substrate 101 surrounded by a printed coil 101b which is formed in a ring shape along the periphery of the IC substrate and which serves as an antenna for receiving an external signal and transmitting an internal signal. The IC card has also a wiring conductor 101a formed extending from the printed coil 101b. The wiring conductor 101a connects the printed coil 101b and the semiconductor chips P, so that signals are transmitted and received between the semiconductor chips P having various functions and the external.

The members of the IC card 100 are laminated with an adhesive as shown in FIG. 59. In other words, a spacer 102 with recesses provided for receiving the printed coil 101b, wiring conductor 101a and mounted semiconductor chips P is bonded face to face to the chip-mounded side of the card substrate 101, so that the spacer 102 is flush with the semiconductor chips P. In addition, a thickness correcting sheet 103 is attached to the spacer 102 so as to adjust thickness to bring the semiconductor chips P such as IC chips and capacitor chips to the bending neutral point of the IC card 100 (the bending neutral point is the center of the thickness of the IC card 100 if the members of both sides of the semiconductor chip P are all equal). When the IC card 100 is bent, the compressing force and tension exerted on the semiconductor chips P can be relieved by this thickness correcting sheet. Moreover, decorated exterior plates 104a, 104b that serve as the front and rear surfaces of the IC card 100 are respectively bonded on both sides of the laminate of card substrate 101, spacer 102 and thickness correcting sheet 103. In this embodiment, the card substrate 101, thickness correcting sheet 103 and decorated exterior plates 104a, 104b are made of PFT.

FIG. 60 is an enlarged view of portion A of FIG. 59. In the chip-mounted region of the IC card 100, the Au bumps 2b are electrically connected to the wiring conductor 101a through the anisotropically conductive adhesive 116 and by its adhesion so that the semiconductors P are mounted on the card substrate 101. Also, the thickness correcting sheet 103 is bonded to the card substrate 101 with the spacer 102 interposed there-between. FIG. 61 is an enlarged view of portion B of FIG. 60. The anisotropically conductive adhesive 116 is formed by an adhesive 116b and conductive particles 116a each of which is formed of, for example, a plastic ball of about 5 μm-diameter with an Au coating. Part of the conductive particles 116a of the anisotropically conductive adhesive 116 is crushed between the Au bump 2b and the wiring conductor 101a. Thus, the Au bump 2b and the wiring conductor 101a can be electrically connected through the crushed conductive particles 116a.

According to the IC card 100 production method of this embodiment, since the carrier 1 and the semiconductor wafer 2 are combined into the wafer composite 10 of which the semiconductor wafer 2 is then thinned to a thickness of, for example, 50 μm without any crack and warp and diced into semiconductor chips P which are used in the assembly process for the IC card 100, the IC card 100 can be made thinner.

The present invention is not limited by the specific embodiments previously mentioned in detail, but is capable of various changes and modifications without departing the scope of the invention.

For example, the base 1a may be molded out of fluororesin, glass plate or epoxy resin, and the suction pad 1b may be a liquid such as water. In this case, the interfacial force is exerted between the semiconductor wafer 2 and the base 1a so that both materials can be bonded together, and in order to peel the carrier 1 from the semiconductor wafer 2, ultrasonic wave is applied to the wafer composite.

INDUSTRIAL APPLICABILITY

The semiconductor wafer processing technique of the invention is useful for the application to the semiconductor chips incorporated in ultra-thin type electronic devices such as IC cards.

What is claimed is:

1. An IC card producing method, comprising the steps of:
providing a semiconductor wafer having a main surface and a rear surface which is opposite to said main surface, said semiconductor wafer having circuit elements and bonding pads formed in said main surface providing bump electrodes at said bonding pads;
providing a film-like carrier formed of a base and an adhesive member provided on one surface of said base, said adhesive member having a thickness which is equal to or larger than a protruding height of said bump electrodes in a thickness direction of said semiconductor wafer;
adhering said semiconductor wafer to said carrier in such a manner that said main surface of said wafer contacts with said adhesive member and said bump electrodes are buried in said adhesive member, and a rear surface of said wafer with no circuit elements formed therein is opposite to said carrier to form a wafer composite;
while holding said wafer composite with said semiconductor wafer up, spin-coating an etchant on the rear surface of said semiconductor wafer thereby thinning said semiconductor wafer,
adhering to a dicing sheet the thinned rear surface of said semiconductor wafer of said wafer composite after said thinning;
peeling off said carrier from said wafer composite;
dicing said semiconductor wafer on said dicing sheet into individual semiconductor chips;
reducing the adhesion of said dicing sheet;
mounting at least one of said semiconductor chips on a card substrate in such a manner that said bump electrodes of at least one of said semiconductor chips are bonded to electrodes formed on said card substrate; and
thereafter producing an IC card by using said IC card substrate with said semiconductor chip mounted thereon, wherein the step of thinning said semiconductor wafer is performed, after the step of providing said bump electrodes at the bonding pads of said semiconductor wafer.

2. An IC card producing method according to claim 1, wherein at said producing step said semiconductor chip is directly mounted on said card substrate from said dicing sheet.

3. A method of manufacturing a semiconductor device, comprising the steps of:
providing a semiconductor wafer having a main surface, a rear surface opposite to the main surface, and a plurality of semiconductor elements in the main surface, the semiconductor wafer having bonding pads formed in the main surface, providing bump electrodes at the bonding pads;
providing a film-like carrier formed of a base and an adhesive member provided on one surface of said base, said adhesive member having a thickness which is equal to or larger than a protruding height of said bump electrodes in a thickness direction of said semiconductor wafer;
adhering said semiconductor wafer to said carrier in such a manner that said main surface of said wafer contacts with said adhesive member, said bump electrodes are buried in said adhesive member, and a rear surface of said wafer with no circuit elements formed therein is opposite to said carrier to form a wafer composite;
reducing a thickness of the semiconductor wafer by grinding the rear surface of the semiconductor wafer, thereby providing a first thickness and a first surface opposite to the main surface; and reducing the first thickness by contacting an etching solution with the first rear surface, thereby providing a second thickness and a second rear surface opposite to the main surface, wherein the step of reducing the thickness of said semiconductor wafer is performed, after the step of providing said bump electrodes at the bonding pads of said semiconductor wafer.

4. A method of manufacturing a semiconductor device according to claim 3, wherein said second thickness of said semiconductor wafer is less than 100 micron.

5. A method of manufacturing a semiconductor device according to claim 3, wherein said second thickness of said semiconductor wafer is about 50 micron.

6. A method of manufacturing a semiconductor device according to claim 3, further comprising:

thereafter dividing said semiconductor wafer into plural chips having semiconductor elements therein; and mounting a selected one of the plural chips on a substrate of an IC card.

7. A method of manufacturing a semiconductor device according to claim 3, wherein said contacting includes spin-coating the etching solution with the first rear surface while continuously blowing gas against the semiconductor wafer from below the supporting substrate.

8. A method of manufacturing a semiconductor device according to claim 3, wherein said providing provides a passivating film as a part of the main surface.

9. A method of manufacturing a semiconductor device according to claim 3, wherein said providing provides a polyimide film as a part of the main surface.

10. A method of manufacturing a semiconductor device according to claim 3, wherein said providing provides a silicon nitride film as a part of the main surface.

11. A method of manufacturing a semiconductor device according to claim 3, wherein said providing provides a silicon nitride film and a polyimide film formed on the silicon nitride as a part of the main surface.

12. A method of manufacturing a semiconductor device, according to claim 3, further comprising:

said reducing thickness including protecting the main surface from circumstance of grinding;

said reducing the first thickness protecting the main surface from the etching solution;

thereafter adhering the semiconductor wafer to a dicing tape; and thereafter dividing the semiconductor wafer into plural chips having semiconductor elements therein, by cutting completely through the semiconductor wafer.

13. A method of manufacturing a semiconductor device, according to claim 12, further comprising:

said providing provides a plurality of bump electrodes on the main surface; and said dividing providing plural chips having semiconductor elements and bump electrodes.

14. A method of manufacturing a semiconductor device, according to claim 12, further comprising:

said protecting including providing the main surface with a surface protective film;

after said adhering, removing the surface protective film from the semiconductor wafer before said dividing.

15. A method of manufacturing a semiconductor device, according to claim 13, further comprising:

thereafter mounting a selected one of the plural chips on a substrate having wiring layers via an anisotropic conductive film such that the bump electrodes are electrically connected with the wiring layers by the anisotropic conductive film.

16. A method of manufacturing a semiconductor device, according to claim 13, further comprising:

thereafter mounting a selected one of the plural chips on a substrate having wiring layers such that the bump electrodes are electrically connected with the wiring layers.

17. A method of manufacturing a semiconductor device, according to claim 3, further comprising:

thereafter dividing the semiconductor wafer into plural chips having semiconductor elements therein, by cutting completely through the semiconductor wafer; and mounting a selected one of the plural chips on a substrate.

18. A method of manufacturing a semiconductor device, according to claim 17, further comprising:

providing the surface with a surface protective film prior to said contacting; and after said contacting, removing the surface protective film prior to said dividing.

19. A method of manufacturing a semiconductor device, according to claim 17, further comprising:

providing the main surface with a surface protective film; and after said grinding removing the surface protective film from the semiconductor wafer.

* * * * *